United States Patent [19]
Seino

[11] Patent Number: 6,147,905
[45] Date of Patent: Nov. 14, 2000

[54] NON-VOLATILE SEMICONDUCTOR MEMORY DEVICE

[75] Inventor: Junji Seino, Kawasaki, Japan

[73] Assignee: Fujitsu Limited, Kawasaki, Japan

[21] Appl. No.: 09/362,708

[22] Filed: Jul. 29, 1999

[30] Foreign Application Priority Data

Jul. 30, 1998 [JP] Japan ................................. 10-215969

[51] Int. Cl.[7] ........................................................ G11C 7/00
[52] U.S. Cl. ............................... 365/185.11; 365/185.11; 365/205; 365/230.03; 365/218; 365/230.01; 365/196; 365/185.18
[58] Field of Search ....................... 365/189.01, 230.01, 365/185.01, 185.11, 205, 230.03, 218, 196, 185.18

[56] References Cited

U.S. PATENT DOCUMENTS 5,410,680  4/1995  Challa et al. ............................. 395/500
5,787,484  7/1998  Norman ................................... 711/159
6,016,280  1/2000  Maesako et al. ......................... 365/226

FOREIGN PATENT DOCUMENTS 6-176559  6/1994  Japan .

*Primary Examiner*—Viet Q. Nguyen
*Attorney, Agent, or Firm*—Arent Fox Kintner Plotkin & Kahn PLLC

[57] ABSTRACT

A non-volatile semiconductor memory device includes memory cell blocks in which n sectors for erasing are defined where n is an integer equal to or greater than 1. Each of the memory cell blocks includes sense amplifiers, and an activation signal generating circuit activating an activation signal for generating the sense amplifiers. Data held in the sense amplifiers of the memory cell blocks are continuously output in accordance with a burst length. Sectors related to blocks corresponding to the burst length are sequentially subjected to an erase operation.

9 Claims, 27 Drawing Sheets

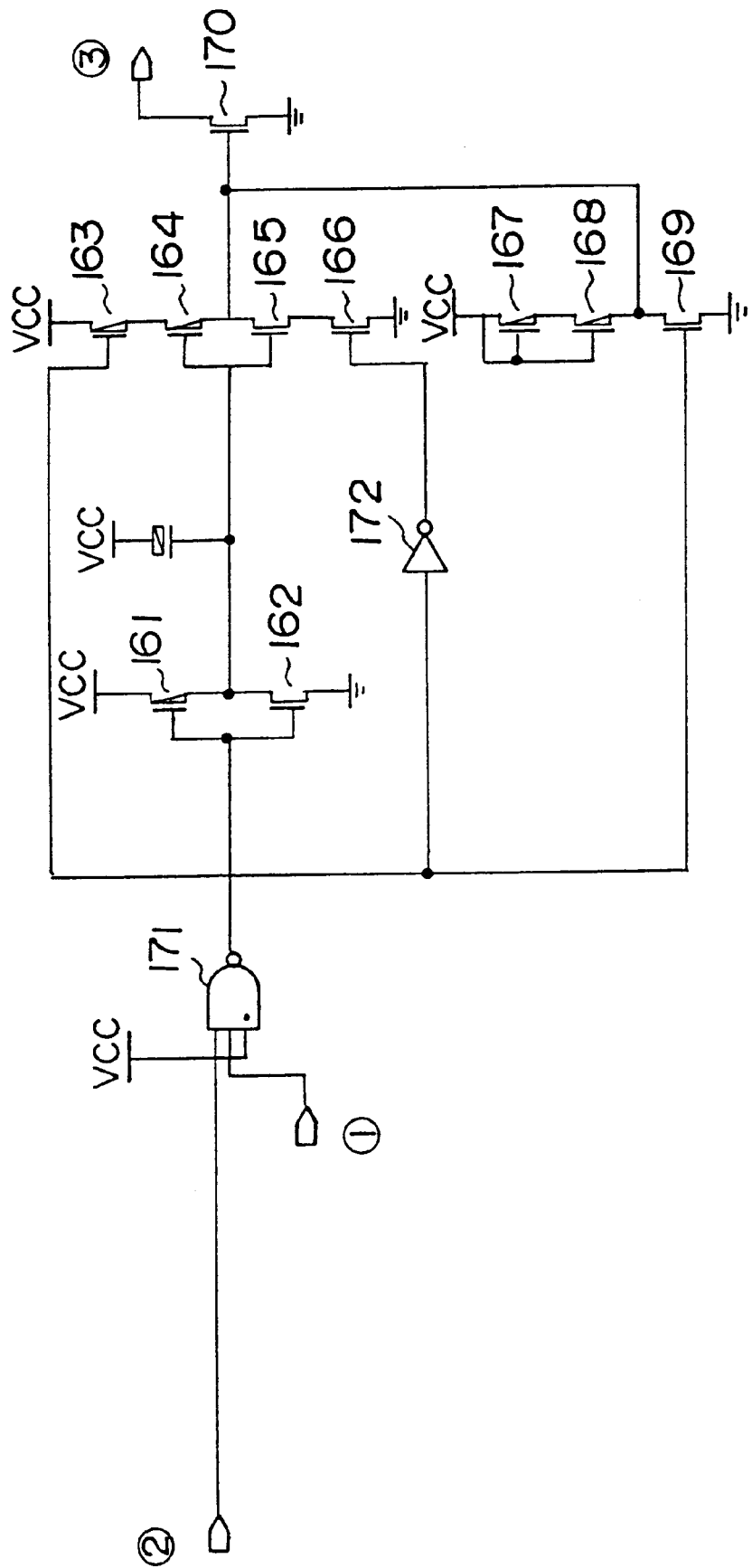
FIG. 18  151, 152

NON-VOLATILE SEMICONDUCTOR MEMORY DEVICE

BACKGROUND OF THE INVENTION

1. Field of the Invention

The present invention relates to a non-volatile semiconductor memory device which operates in synchronism with an external clock.

A non-volatile semiconductor memory device such as a flash ROM is widely used together with an MPU (MicroProcessor Unit) and a peripheral circuit. As the MPU and the peripheral circuit speed up, it is required that the non-volatile semiconductor memory device performs the read operation at a higher speed.

Nowadays, a synchronous-type MPU and a synchronous-type peripheral circuit are widely used, and the non-volatile semiconductor memory device is thus required to operate in a synchronous fashion.

2. Description of the Related Art

FIG. 1 illustrates a conventional non-volatile semiconductor memory device. The device includes an address buffer 401, a memory cell array 402, a word line select circuit 403, a bit line select circuit 404, a sense amplifier group 405, a sense amplifier select circuit 406, an output buffer 407. The sense amplifier unit 405 includes sense amplifier units 405a, 405b, 405c and 405d, each of which units includes 16 sense amplifiers. Thus, the sense amplifier unit 405 includes 64 sense amplifiers.

An address is applied to the address buffer 401 from the outside of the device. Then, upper and lower addresses of the external address are separated into each other and are output from the address buffer 401. The upper address is used to read data from the memory cell array 402, and the lower address is used to further select data from among the read data. The upper address is used to specify one word line WL and bit lines BL so that data stored in all memory cells connected to the selected bit lines BL are read thereto. The lower address is used to control the sense amplifier select circuit 406 so that it selects one of the sense amplifier units 405a–405d in order to latch the read data.

The non-volatile semiconductor memory device thus configured has a performance such that the time necessary to latch data in the sense amplifier group 405 responsive to the upper address is longer than the time necessary to perform the read operation of the sense amplifier group 405 responsive to the lower address. As shown in FIG. 2, the above performance results from the time it takes to read data from the selected memory cells and latch the read data in the sense amplifier group 405. Particularly, at the time of latching data in the sense amplifier group 405, there is a sense waiting time during which the potentials are not settled after the sense amplifier group 405 is activated. After the sense waiting time, the data are latched in the sense amplifier group 405. Hence, it takes a long time to latch the data in the sense amplifier group 405.

Further, referring to FIG. 2, there is illustrated a read operation performed when the burst length is equal to 4. A symbol "X" denotes a latency time starting from the time when the address is applied. The latency time X is the sum of the time necessary to read data from the memory cells and the above-mentioned sense waiting time. When the read operation with the burst length equal to 4 is repeatedly performed, data stored in the sense amplifier units 405a–405d can successively be read therefrom. However, if the address changes and a different word line WL is selected, the latency time X is needed again. Hence, the read operation cannot be performed at a high speed.

If the burst length is increased to, for example, 8, 16 or 32, an increased number of sense amplifiers such as 128, 256 or 512 is needed to realize the continuous read operation. That is, an increased number of sense amplifiers needs an increased number of sense amplifiers. However, an increased number of sense amplifiers occupies an increased chip area and causes an increased amount of current consumed in the chip.

SUMMARY OF THE INVENTION

It is a general object of the present invention to provide a non-volatile semiconductor memory device in which the above disadvantages are eliminated.

A more specific object of the present invention is to provide a non-volatile semiconductor memory device in which data can be read at a higher speed without consuming a large amount of energy and increasing the chip size.

The above objects of the present invention are achieved by a non-volatile semiconductor memory device which includes memory cell blocks in which n sectors for erasing are defined where n is an integer equal to or greater than 1. Each of the memory cell blocks includes sense amplifiers, and an activation signal generating circuit generating an activation signal for activating the sense amplifiers. Data held in the sense amplifiers of the memory cell blocks are continuously output in accordance with a burst length. Sectors related to blocks corresponding to the burst length are sequentially subjected to an erase operation.

BRIEF DESCRIPTION OF THE DRAWINGS

Other objects, features and advantages of the present invention will become more apparent from the following detailed description when read in conjunction with the accompanying drawings, in which:

FIG. 18 is a circuit diagram of a first ATD signal generating circuit shown in FIGS. 17A and 17B;

DESCRIPTION OF THE PREFERRED EMBODIMENTS

Figure 1:
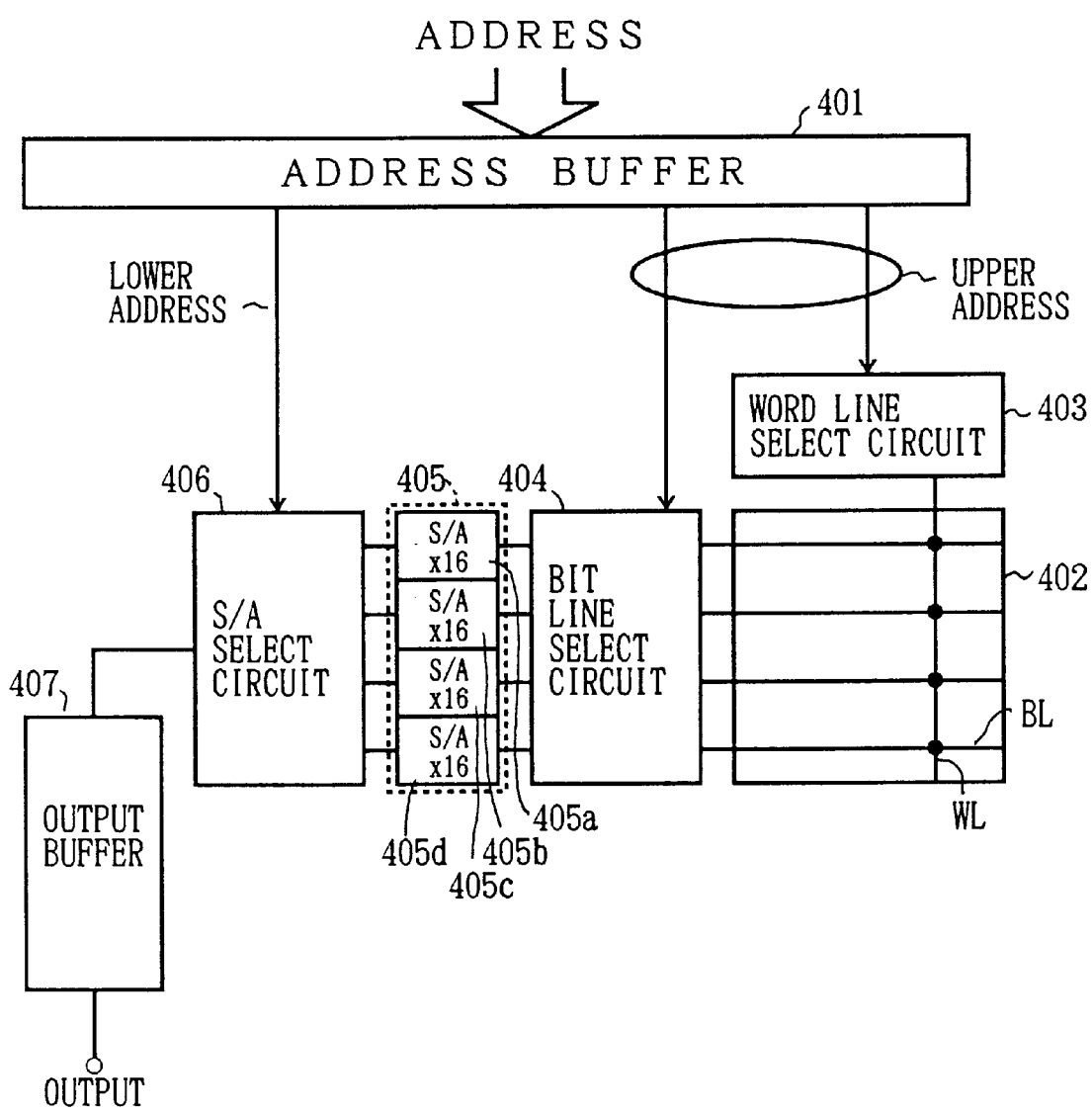
FIG. 1 is a block diagram of a conventional non-volatile semiconductor memory device.

First, a description will be given of the principle of the present invention.

A first aspect of the principle of the present invention will be described below.

A non-volatile semiconductor memory device of the present invention, a memory cell array is divided into a plurality of blocks , which are operated in a pipeline formation. The address area corresponding to the memory cell array is divided into a plurality of parts. Each of the plurality of blocks is provided with a plurality of sense amplifier groups, and each of groups comprises a predetermined number of sense amplifiers equal to the number of output bits of the non-volatile semiconductor memory device. The address externally supplied indicates one of the blocks of the memory cell array. The sense amplifier groups in the selected memory cell block are activated, and data stored in the memory cells connected to the selected bit and word lines are then read and stored in the sense amplifier groups thus activated. Further, the sense amplifier groups of another memory cell block, which is address-adjacent to the first selected block, are activated and store data read from the selected memory cells. Thus, an amount of read data equal to two blocks of the memory cell array is stored in the sense amplifiers. If there are three or more memory cell blocks, the sense amplifier groups of the remaining blocks are activated, as described above.

Then, the read data stored in the sense amplifier group related to the memory cells specified by the address are selected by an output data switch circuit and are then output to an output buffer. Next, the read data stored in the sense amplifier group adjacent to the first selected group are selected, and are then output to an output buffer. When the above read data output operation shifts to the next memory cell block, in other words, when the next selected sense amplifier group is located in the next block of the memory cell array, the memory cell block from which the read data output operation shifts is subjected to the next data read operation.

The above-mentioned operation is repeatedly performed. Hence, read data can continuously output without increasing the number of sense amplifiers as the burst length becomes longer. In the above-mentioned manner, the read data output operation with a desired burst length can be realized by a plurality of blocks of the memory cell array which are operated in the pipeline formation.

A second aspect of the present invention will be described below.

The non-volatile semiconductor memory device is required to have an erase operation in which data stored in all memory cells in an erase sector are erased at one time. The erase sector is the erasing unit. In the erase operation, a negative voltage of, for example, −9 V is applied to the gate of each cell transistor in the erase sector, and a positive voltage of, for example, +5 V is applied to the source thereof. In the erase operation, it is preferable to erase, at one time, data stored in a plurality of memory cell blocks which are operated in the pipeline formation in order to obtain the desired burst length. In this case, the erase sector may be set so as to cover the plurality of memory cell blocks related to the burst length. In other words, the size of the erase sector is required to be larger as the burst length becomes longer. However, it is not preferable to increase the size of the erase sector as the burst length becomes longer because an increased size of the erase sector requires a higher drive ability write voltage generating circuit and a higher drive ability erase voltage generating circuit, and thus requires a larger chip size.

With the above in mind, according to the present invention, a global erase sector consisting of one or a plurality of local erase sectors is defined, that is, n local erase sectors where n is an integer equal to or greater than 1. The global erase sector corresponds to the burst length. The local erase sectors have a size, which is, for example, the same as that of the erase sectors generally used in the conventional flash memories. The local erase sectors are sequentially subjected to the erase operation one by one. Hence, it is not necessary to increase the drive abilities of the circuits for erasing. In other words, the memory cells related to the desired burst length can be subjected to the one-time erase operation by using the conventional write voltage and erase voltage generating circuits.

The non-volatile semiconductor memory device can be viewed from the outside thereof so that a plurality of sectors (local sectors) related to the burst length can be viewed as a single unit, namely the global sector. Thus, it is enough to issue a single erase command with respect to the global sector. In other words, it is not necessary to issue the erase command a number of times dependent on the number of local sectors.

A description will now be given of a non-volatile semiconductor memory device according to an embodiment of the present invention.

Figure 3:
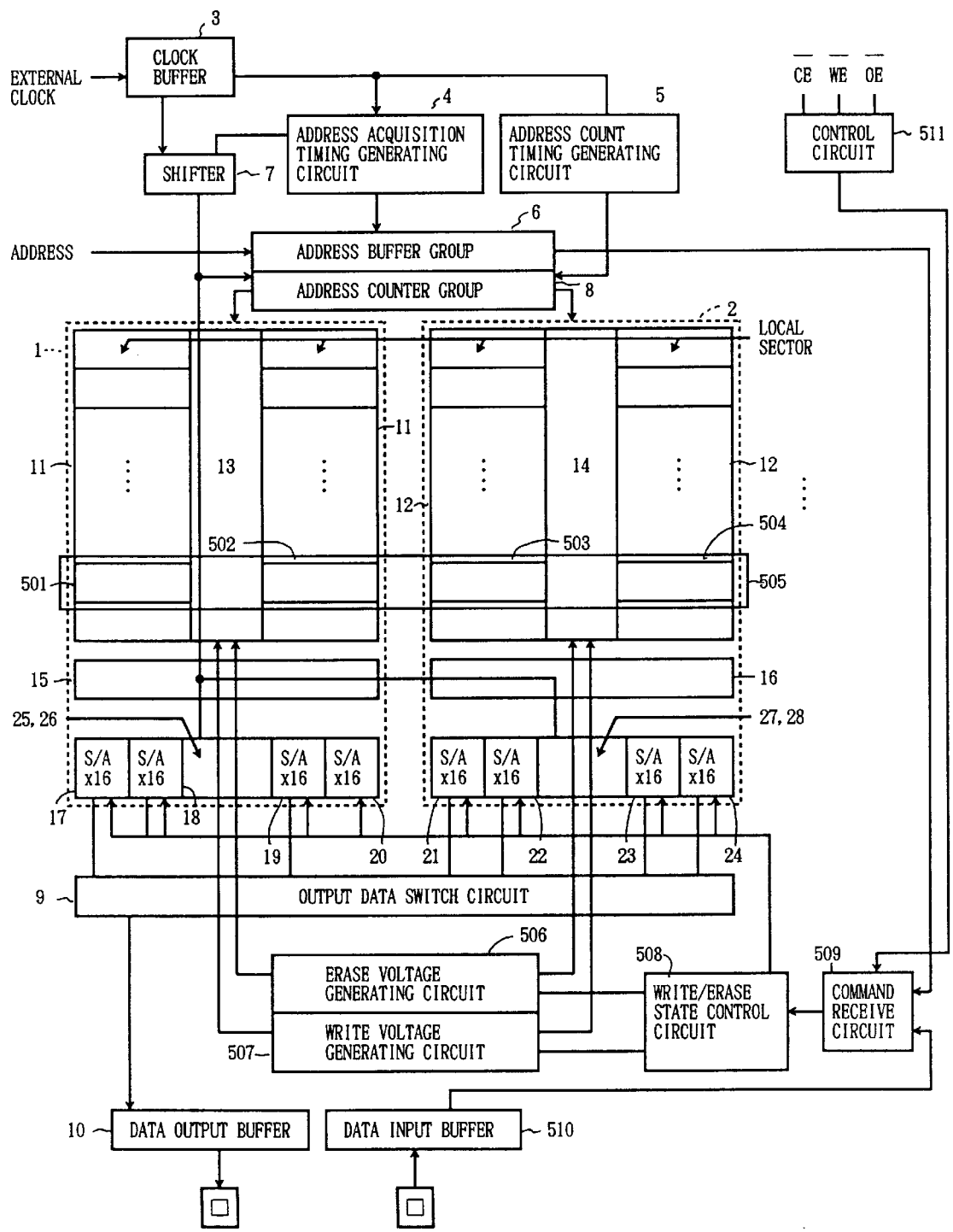
FIG. 3 is a block diagram of a non-volatile semiconductor memory device according to an embodiment of the present invention.

FIG. 3 is a block diagram of the entire structure of a non-volatile semiconductor memory device according to an embodiment of the present invention.

The device includes a first block 1 and a second block 2. Each of the first and second blocks includes a plurality of memory cells arrayed in a matrix formation. The non-volatile semiconductor memory device includes a clock buffer 3, an address acquisition timing generating circuit 4, an address count timing generating circuit 5, an address buffer group 6, a shifter 7, an address counter 8, an output data switch circuit 9, and a data output buffer 10. Further, the device shown in FIG. 3 includes, as elements involved with the erase operation, an erase voltage generating circuit 506, a write voltage generating circuit 507, a write/erase state control circuit 508, a command receive circuit 509, a 16-bit data input buffer 510, and a control circuit 511.

In the first block 1, the memory cells are arranged in rows and columns so as to form memory cell arrays (cores) 11. Similarly, the memory cells of the second block 2 are arranged in rows and columns so as to form memory cell arrays (cores) 12. The number of memory cell blocks is not limited to two, but an arbitrary number of blocks can be used.

The first block 1 includes, in addition to the memory cell arrays 11, a row decoder 13, a column decoder 15, sense amplifier groups 17, 18, 19 and 20, an internal clock generating circuit 25, and a sense amplifier activating circuit 26. Similarly, the second block 2 includes, in addition to the memory cell arrays 12, a row decoder 14, a column decoder 16, sense amplifier groups 21, 22, 23 and 24, an internal clock generating circuit 27, and a sense amplifier activating circuit 28. Each of the sense amplifier groups 17–24 includes 16 sense amplifiers, and read data can be output every 16 bits. The number of sense amplifier groups is not limited to eight, and the number of sense amplifiers included in each sense amplifier group is not limited to 16.

An external clock is applied to the clock buffer 3, which generates an internal clock which is in phase with the external clock. The internal clock is supplied to the address acquisition timing generating circuit 4, the address count timing generating circuit 5, and the shifter 7.

The address acquisition timing generating circuit 4 receives the internal clock and an acquisition timing signal LBABR which is supplied from the outside of the device, and generates therefrom a timing signal (pulse signal) which defines the timing at which the input address is acquired. The above timing signal is also used to trigger off an activation of the sense amplifiers provided in the block specified by the address.

The address count timing generating circuit 5 receives the internal clock and a count enable signal BAABR, and generates a timing signal used to automatically count up the acquired address in accordance with the burst length to be used.

The shifter 7 receives the internal clock and the timing signal generated by the address acquisition timing generating circuit 4, and generates therefrom a timing signal (pulse signal) which triggers off an activation of the sense amplifiers in the memory cell block which should be selected after the memory cell block specified by the input address is selected. In the present embodiment, the timing signal generated by the shifter 7 is located one clock behind the timing signal generated by the address acquisition timing generating circuit 4. However, the shifter 7 may generate the timing signal at the same time as the address acquisition timing generating circuit 4 generates the timing signal.

The address buffer group 6 latches the address acquired at the timing defined by the address acquisition timing generating circuit 4, and outputs the latched address to the address counter 8. The address counter 8 outputs the received address to the row decoders 13 and 14 and the column decoders 15 and 16, and further increments the received address in synchronism with the timing signal generated by the address count timing generating circuit 5. The row decoders 13 and 14 and the column decoders 15 and 16 select word and bit lines specified by the input address. Data stored in the memory cells connected to the selected word and bit lines are read on the bit lines. In the present embodiment, 64-bit memory cell data are read on the bit lines.

In each of the internal clock generating circuits 25 and 27, an activation signal for activating the sense amplifiers of the memory cell blocks is generated based on the address supplied from the address counter 8, the timing signal (pulse signal) generated by the address acquisition timing generating circuit 4 and the timing signal (pulse signal) generated by the shifter 7. For example, when the input address is related to the first block 1, the internal clock generating circuit 25 generates the activation signal for activating the sense amplifiers in the first block 1 in response to the timing signal generated by the address acquisition timing generating circuit 4. Thereafter, the internal clock generating circuit 27 generates the activation signal for activating the sense amplifiers in the second block In response to the timing signal generated by the shifter 7.

The sense amplifier activation circuit 26 activates all the sense amplifiers of the sense amplifier groups 17, 18, 19 and 20 in response to the activation signal generated by the internal clock generating circuit 25. Thereafter, the sense amplifier activation circuit 28 activates all the sense amplifiers of the sense amplifier groups 21, 22, 23 and 24 in response to the activation signal generated by the internal clock generating circuit 27. Thus, data equal to two blocks read from the memory cell arrays 11 and 12 are stored in the respective sense amplifiers.

At this time, if 16-bit data related to the input address externally supplied is stored in the cell amplifier group 17, the output data switch circuit 9 selects the sense amplifier groups one by one starting from the sense amplifier group 17 in response to the count-up (increment) operation of the address counter 8. Thus, data is output, every 16 bits, from the non-volatile semiconductor memory device via the data output buffer 10. For example, when the burst length is equal to 1, only data stored in the sense amplifier group 17. When the burst length is equal to eight, data stored in the sense amplifier groups 17–24 are continuously output every 16 bits.

After the read operation shifts from the first block 1 (the sense amplifier groups 17–20) to the second block 2 (the sense amplifier groups 21–24), the internal clock generating circuit 25 generates the activation signal, and the sense amplifier activation circuit 26 activates the sense amplifiers of the first block 1 again. Then, next data read from the memory cell arrays 11 are stored in the activated sense amplifiers of the groups 17–20 of the first block 1. From now and on, the sense amplifiers of the first and second blocks 1 and 2 are alternately activated in accordance with the burst length used in the non-volatile semiconductor memory device, and thus data stored in the sense amplifier groups 17–24 are output every 16 bits.

In the above description, the sense amplifier group 17 is related to the input address externally supplied. However, the input address may be related to any of the sense amplifier groups 17–24. For example, 16-bit data is read from the sense amplifier group 20 of the first block 1 first, and 16-bit data is read from the sense amplifier group 21 of the second block 2 second.

Figure 2:
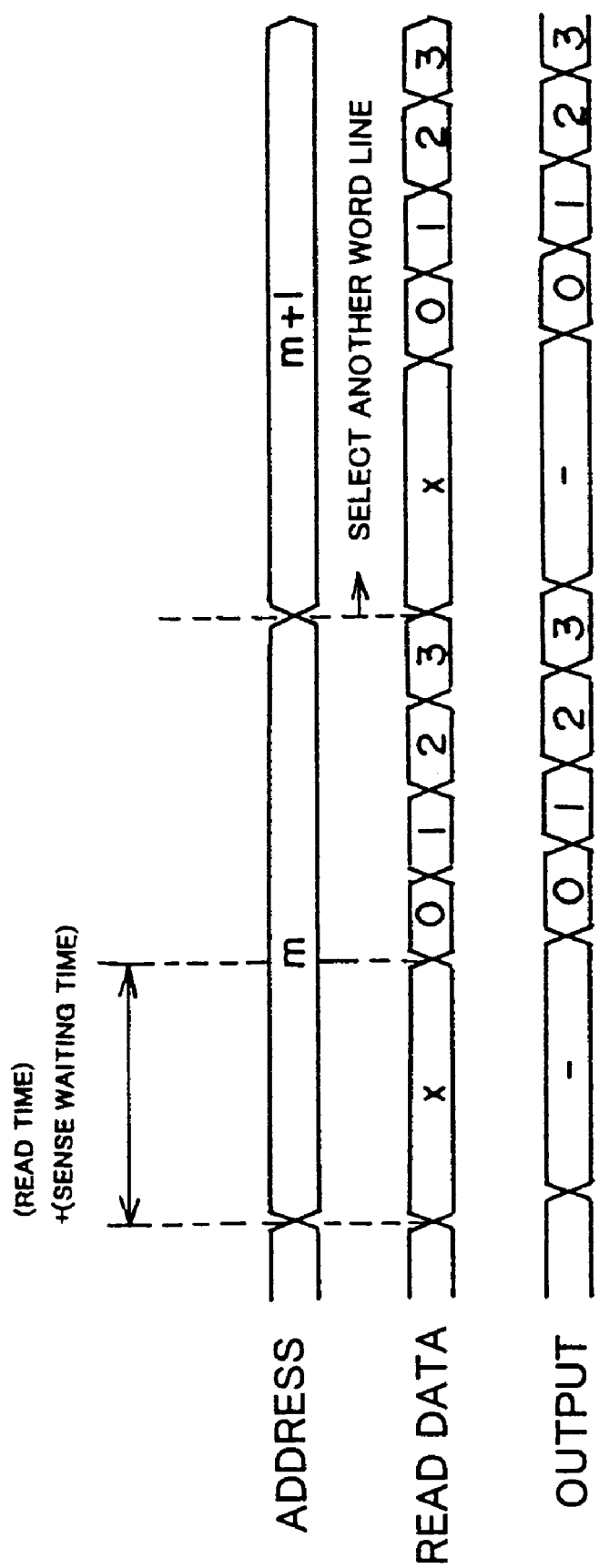
FIG. 2 is a timing chart of a data read operation of the memory device shown in FIG. 1.

As described above, according to the present embodiment, the memory cell array is divided into a plurality of blocks, and the sense amplifiers of the plurality of memory cell blocks are activated in the pipeline formation so that the sense amplifiers of the respective blocks are sequentially activated and all the sense amplifiers of each of the blocks are activated simultaneously. Thus, data to be next read are stored in the sense amplifiers while the current data is being read regardless the conventional wait time X (shown in FIG. 2). As a result of the pipeline operation, data can continuously be read without any break or interruption at a high speed. The sense amplifiers are alternately or sequentially activated on the divided block base, so that there is no need to increase the number of sense amplifiers as the burst length becomes longer. The above advantage makes it possible to reduce the chip area and power consumption.

A description will be given of the erase operation of the non-volatile semiconductor memory device shown in FIG. 3.

The erase voltage generating circuit 506 generates an erase voltage, which is supplied to the row decoders 13 and 14 of the first and second blocks 1 and 2. The write voltage generating circuit 507 generates a write voltage, which is supplied to the row decoders 13 and 14. The row decoders 13 and 14 apply the erase voltage to the cell transistors and apply the write voltage thereto. The erase voltage generating circuit 506 and the write voltage generating circuit 507 are controlled by the write/erase state control circuit 508, as will be described later.

The write/erase state control circuit 508 operates in response to a control signal supplied from the command receive circuit 509. The command receive circuit 509 decodes a command defined by predetermined signals supplied from the address buffer group 6, the control circuit 511 and the data input buffer 510.

The control circuit 511 receives a write enable signal /WE (symbol "/" denotes an active-low signal), an output enable signal /OE, and a chip select signal /CE. These signals are supplied from the outside of the non-volatile semiconductor memory device, and are supplied to the command receive circuit 509. The input address is supplied to command receive circuit 509 in order to control the circuits 506 and 507. Commands for controlling the non-volatile semiconductor memory device can be defined by various combinations of predetermined signals. For example, the write/erase state control circuit 508 is controlled by an erase command defined by the input address, the write enable signal /WE, the output enable signal /OE, and given data supplied via the data input buffer 510.

Figure 4:
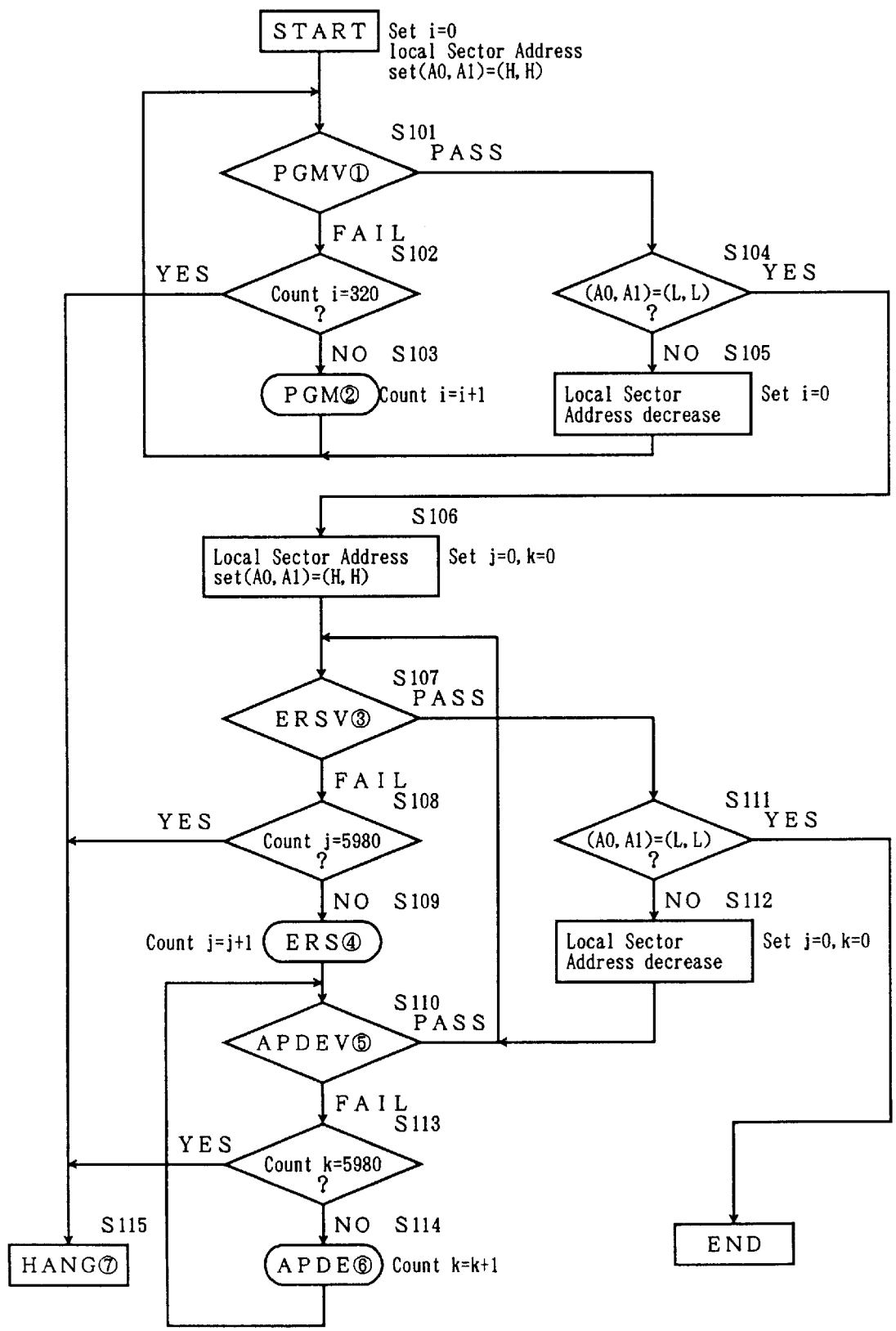
FIG. 4 is a flowchart of a sequence of an erase operation carried out in the memory device shown in FIG. 3.

The erase operation is carried out by the erase voltage generating circuit 506 and the write voltage generating circuit 507 under the control of the write/erase state control circuit 508 in accordance with a sequence shown in FIG. 4 based on the aforementioned second aspect of the principle of the present invention. The control circuit 508 also controls the sense amplifiers provided in the first and second blocks 1 and 2.

As shown in FIG. 3, a global sector 505 is defined so as to extend over the first block 1 and the second block 2 and include local sectors 501–504. The size of the global sector 505 corresponds to the burst length used in the present non-volatile semiconductor memory device. The local sectors 501–504 are sequentially selected one by one, so that the erase operation on the global sector can be realized by merely applying the single erase command to the non-volatile semiconductor device, in other words, applying the erase command thereto only at one time.

FIG. 4 is a flowchart of a sequence of the erase operation on the global sector 505. Steps S101–S105 define a programming process for setting cell data of the cells in the local sectors 501–504, that is, the global sector 505 to "0". Steps S101–S103 define a process for setting all cell data in one of the local sectors 501–504 to "0", and are repeated by the control of steps S104 and S105 so that all the local sectors 501–504 are processed.

Steps S107–S112 define an erase/verify process. Steps 107–S110 define a process for the erase/verify process for one of the local sectors 501–504 and are repeated by the control of steps S111 and S112 so that all the local sectors 501–504 are processed.

Steps S113 and S114 define a compensating process for compensating for a leakage current.

Parameters "i", "j" and "k" are used in the above-mentioned programming process, the erase/verify process, and the compensating process, respectively, and define respective threshold values. Further, a local sector (A0, A1) is defined to select the local sectors 501–504 one by one. For example, when (A0, A1) is (H, H) and (L, L), then the local sectors 504 and 501 are respectively specified.

The sequence shown in FIG. 4 starts in response to the erase command decoded by the write/erase state control circuit 508. At the commencement of the sequence, the parameters "i", "j" and "k" are respectively set to 0, and the local sector address (A0, A1) is set to (H, H).

At step S101, the control circuit 508 determines whether all cell data in the sense amplifiers of the sense amplifier group 24 associated to the local sector 504 specified by the local sector address (H, H) are "0". The above determination process is denoted as PGMV in FIG. 4. If the answer of step S101 is YES (pass decision), a determination step of step S104 is performed. If the answer of step S101 is NO (fail decision), the control circuit 508 determines, at step S102, whether the value of the parameter i is equal to a threshold value of 320. The threshold value of 320 is based on whether an error in programming exists in the memory cells of the local sector of interest (initially, the local sector 504). Thus, the control circuit 508 controls, at step S103, the write voltage generating circuit 507 to supply the write voltage to the memory cells of the local sector 504 via the row decoder 14. The above programming process of step S103 is denoted as PGM in FIG. 4. At step S103, the control circuit 508 increments the value of the parameter i by 1, and executes step S101 again.

The process of steps S101–S103 is repeatedly performed until the result of step S101 becomes YES. If the result of step S102 becomes YES, the sequence of FIG. 4 is ended with an error indication at step S115 (HANG).

At step S104, the control circuit 508 determines whether (A0, A1)=(L, L). When the result of step S104 is NO, it is meant that all of the four local sectors 501–504 have not been processed. In this case, the local sector address (A0, A1) is decremented by 1 so that (A0, A1) becomes equal to (H, L). Then, step S101 is performed again.

When all the local sectors 501–504 have been subjected to the process of steps S101–S103 and the result of step S104 becomes YES, the control circuit 508 resets the local sector address (A0, A1) to (H, H), and executes step S107.

At step S107, the control circuit 508 determines whether all cell data in the sense amplifiers related to the local sector 504 specified by the local sector address (H, H) are "1". The above determination process is denoted as ERSV in FIG. 4. If the answer of step S107 is YES (pass decision), step S111 is executed. If the answer of step S107 is NO (fall decision), the value of the parameter "j" is equal to a threshold value of 5980. If the answer of step S108 is YES, the sequence is ended with an error indication at step S115. The threshold value of 5980 is based on whether an error in erasing exists in the memory cells of the local sector of interest (initially, the local sector 504). Thus, the control circuit 508 controls, at step S109, the erase voltage generating circuit 506 to supply the erase voltage to the memory cells of the local sector 504 via the row decoder 14. The above erasing process is denoted as ERS in FIG. 4. At step S109, the value of the parameter j is incremented by 1.

At step S110, the control circuit 508 determines whether leakage currents flowing in the non-selected cells have a magnitude less than a threshold leakage current. If it is determined that the leakage currents are greater than the threshold leakage current, step S113 is performed. On the other hand, if it is determined that the lead currents are lower than the threshold leakage current, the process returns to step S107.

The process of steps S107–S109 is repeatedly performed until the result of step S107 becomes YES within the range in which the value of the parameter j is smaller than the threshold value of 5980. When the result of step S107 becomes YES, it is determined, at step S111, whether the local sector address (A0, A1) is (L, L). When the result of step S111 is YES, the sequence of FIG. 4 is ended. If the answer of step S111 is NO, step S112 is performed. At step S112, the local sector address (A0, A1) is decremented by 1, and the parameters j and k are reset to 0. Then, step S107 is performed again.

When the result of step S110 is NO (fail decision), the control circuit 508 determines, at step S113, whether the value of the parameter k is equal to a threshold value of 5980. The process of step S113 is performed when the leakage currents greater than the threshold leakage current flows. That is, when an over-erase occurs, step S113 is performed. At step S114, a light writing operation on the cells of the local sector currently selected is performed in order to reduce the leakage currents. The above operation is denoted as APDE in FIG. 4. In the light writing operation, a slight current is made to flow in the cells. Then, the determination of step S110 is performed again. The light writing operation is repeatedly performed until the result of step S110 becomes YES. If it is determined, at step S113, that the parameter k becomes equal to 5980, the sequence is ended with an error indication at step S115.

Figure 5:
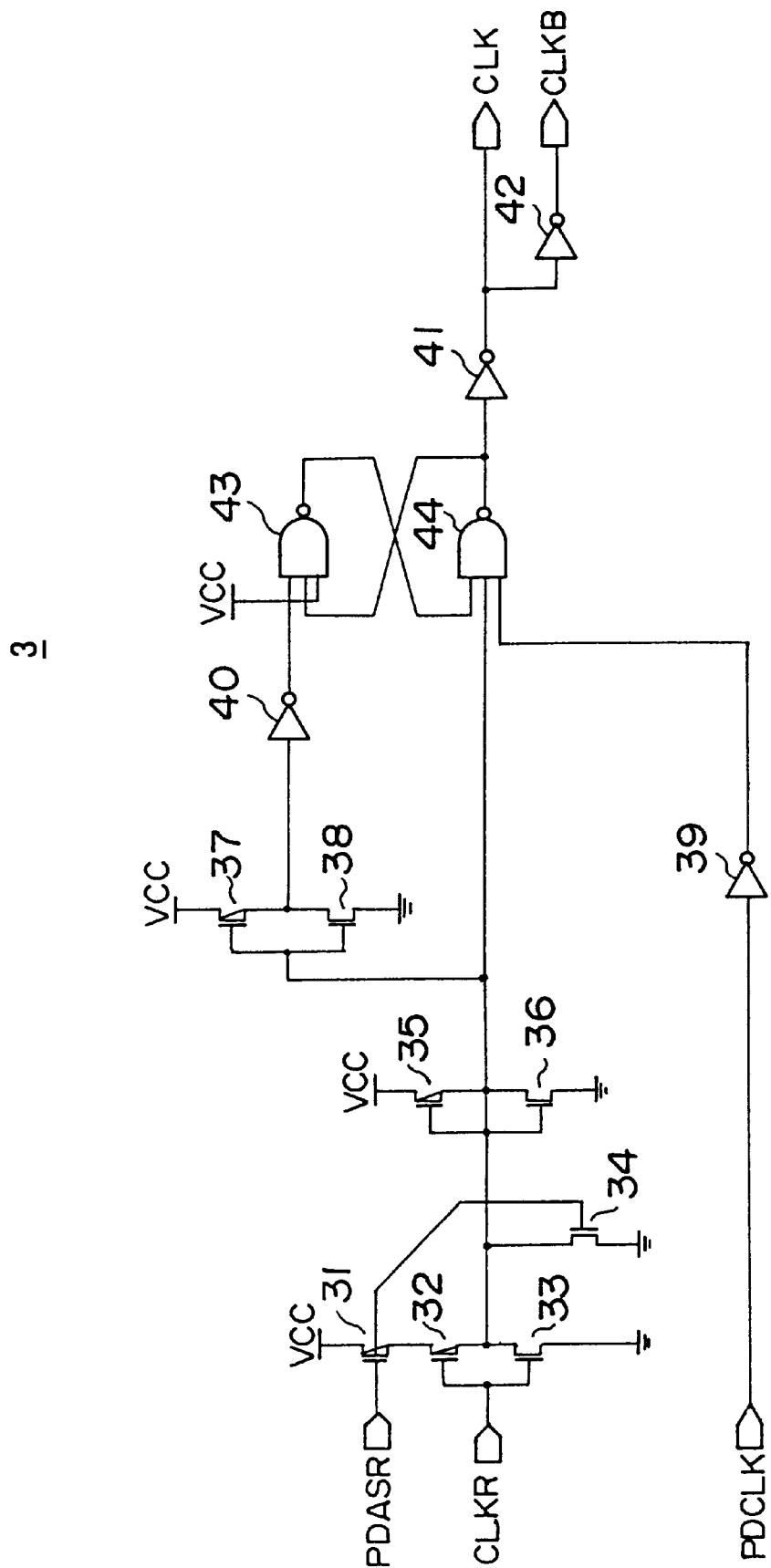
FIG. 5 is a circuit diagram of a clock buffer shown in FIG. 3.
Figure 6:
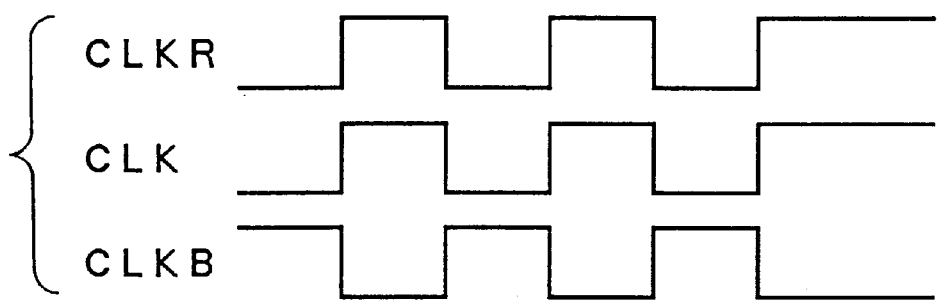
FIG. 6 is a timing chart of an operation of the clock buffer shown in FIG. 5.

FIG. 5 is a circuit diagram of the clock buffer 3, which is made up of transistors 31–38, inverters 39–42, and NAND gates 43 and 44. Signals PDASR and PDCLK are fixed to the low level. The clock buffer 3 receives an external clock CLKR supplied from the outside of the semiconductor device. Three inverters are formed by the transistors 32, 33, 35, 36, 37 and 38, as shown in FIG. 5. The external clock CLKR passes through the three inverters and further passes through the inverter 40. The NAND gates 43 and 44 function to shape the respective input signals. The output signal of the inverter 41 serves as a first internal clock CLK which is a delayed version of the external clock CLKR and is in phase therewith, as shown in FIG. 6. The inverter 42 outputs a second internal clock CLKB, which is the inverted version of the first clock signal CLK, as shown in FIG. 6. The first and second internal clocks CLK and CLKB are supplied to the following circuits.

Figure 7:
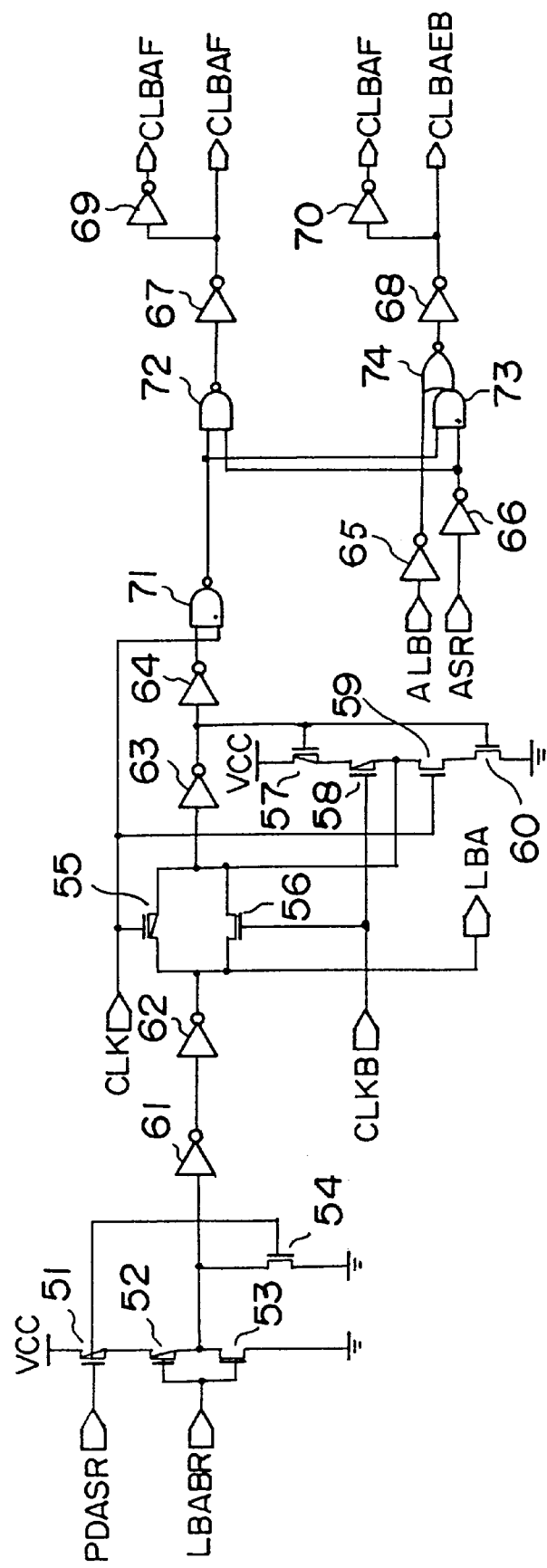
FIG. 7 is a circuit diagram of an address acquisition timing generating circuit shown in FIG. 3.

FIG. 7 is a circuit diagram of the address acquisition timing generating circuit 4, which includes transistors 51–60, inverters 61–70, NAND gates 71 and 72, an AND gate 73, and a NOR gate 74. Signals PDASR and ASR are fixed to the low level, and a signal ALB is fixed to the high level.

Figure 8:
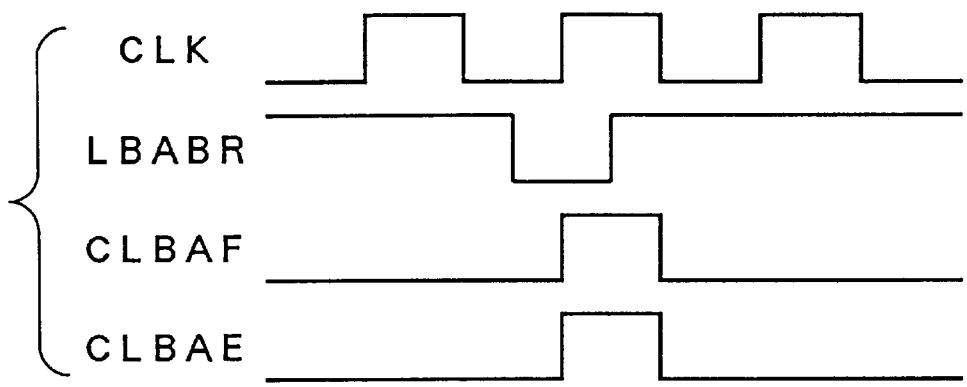
FIG. 8 is a timing chart of an operation of the address acquisition timing generating circuit shown in FIG. 7.

When the signal LBABR externally supplied and used to acquire the input address switches to the low level in a state in which the first and second internal clocks CLK and CLKB are continuously supplied, the address acquisition timing generating circuit 4 generates, as shown in FIG. 8, pulse signals CLBAF and CLBAE synchronized with the first internal clock CLK, and pulse signals CLBAFB and CLBAEB obtained by inverting the pulse signals CLBAF and CLBAE, respectively. The above pulse signals are used to acquire the input address, and function to trigger off an activation of the sense amplifiers provided in the block specified by the address.

Figure 9:
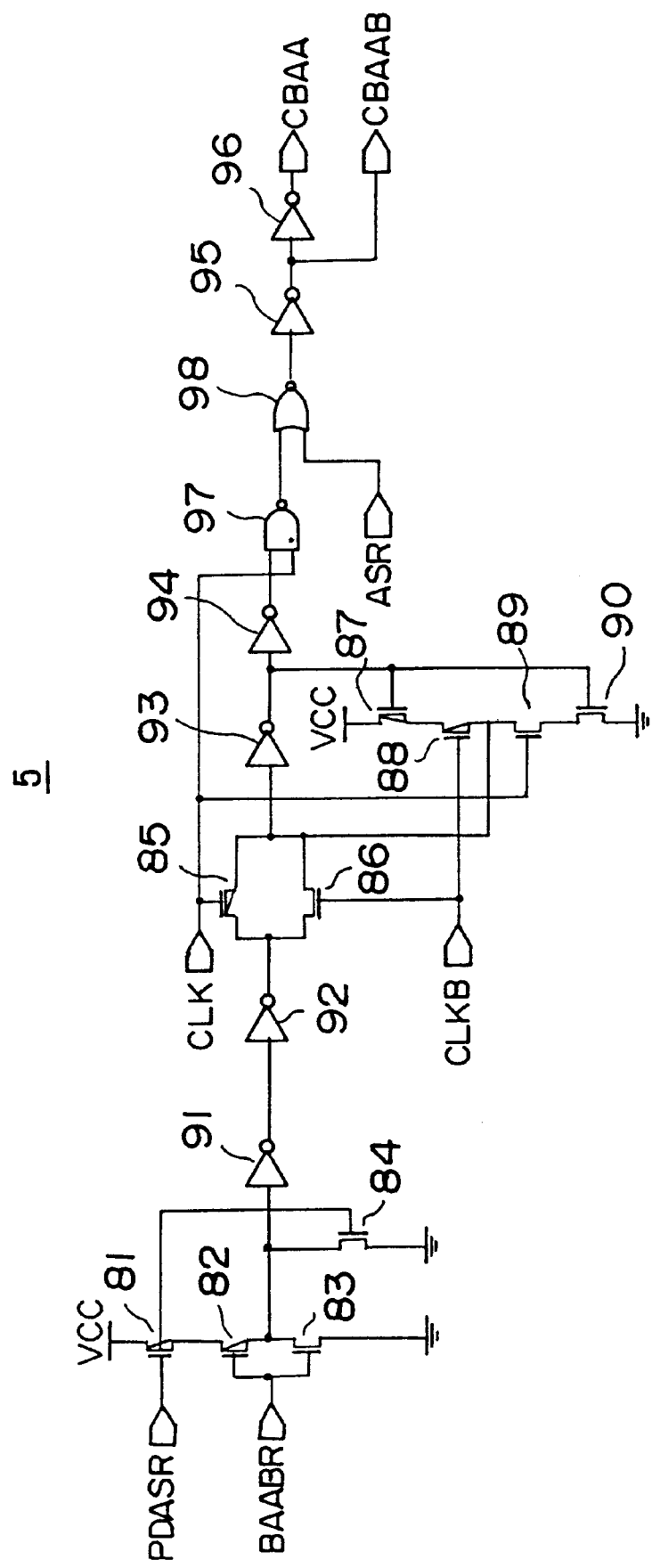
FIG. 9 is a circuit diagram of an address count timing generating circuit shown in FIG. 3.

FIG. 9 is a circuit diagram of the address count timing generating circuit 5, which is made up of transistors 81–90, inverters 91–96, an NAND gate 97, and a NOR gate 98. The signals PDASR and ASR are fixed to the low level.

Figure 10:
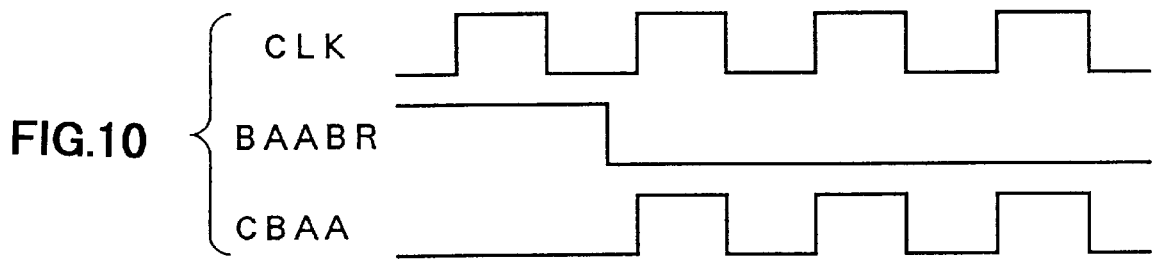
FIG. 10 is a timing chart of the address count timing generating circuit shown in FIG. 9.

When the count enable signal BAABR externally supplied and used to start counting up the external address switches to the low level in a state in which the first and second internal clocks CLK and CLKB are continuously supplied, the address count timing generating circuit 5 generates, as shown in FIG. 10, a third internal clock CBAA synchronism with the first internal clock CLK, and a fourth internal clock CBAAB which is the inverted version of the third internal clock CBAA. The third and fourth clocks CBAA and CBAAB are output during the time when the count enable signal BAABR is maintained at the low level. In other words, the third and fourth clocks CBAA and CBAAB are driven in accordance with the burst length used in the semiconductor device.

Figure 11:
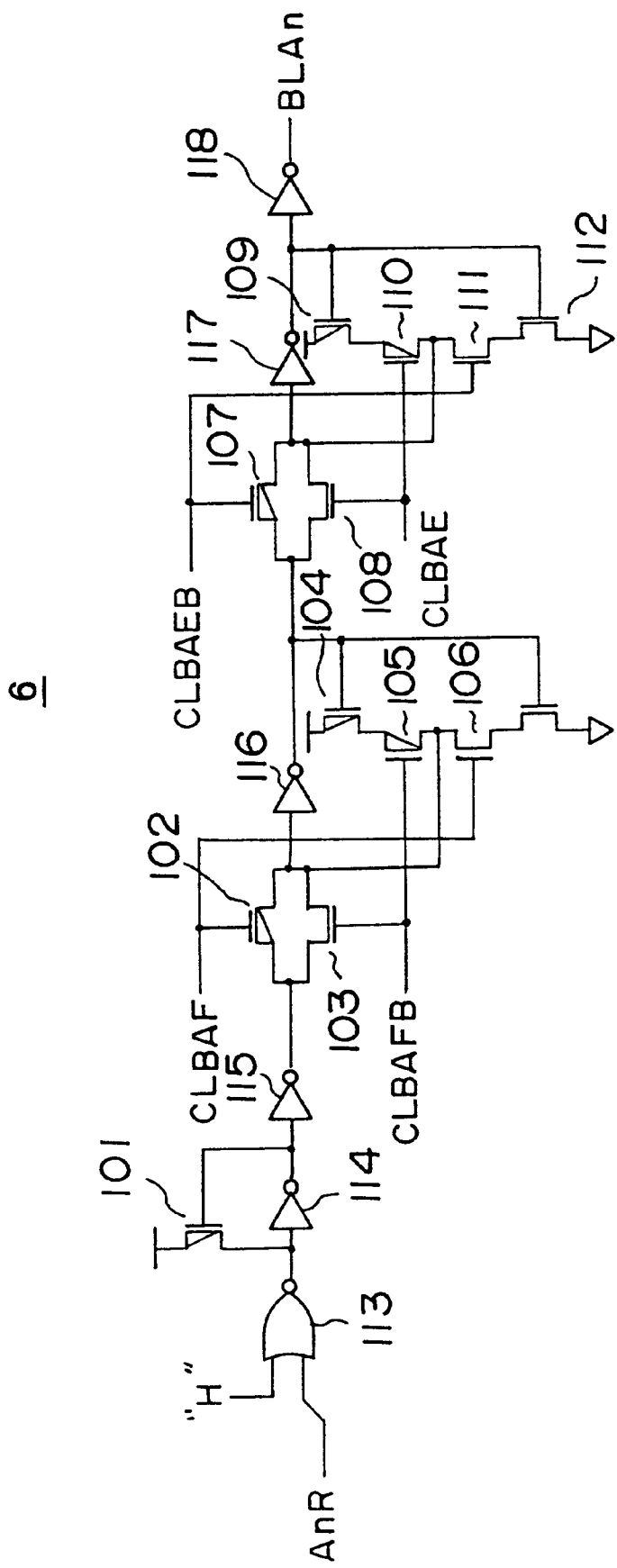
FIG. 11 is a circuit diagram of an address buffer provided in an address buffer group shown in FIG. 3.

FIG. 11 is a circuit diagram of one of the address buffers in the address buffer group 6. The circuit shown in FIG. 11 is related to an address AnR (n is an integer), and is made up of transistors 101–112, inverters 114–118, and an NAND gate 113. The number of address bits A0R–AnR depends on the memory capacity. Hence, the address buffer group 6 includes n+1 address buffers.

Figure 12:
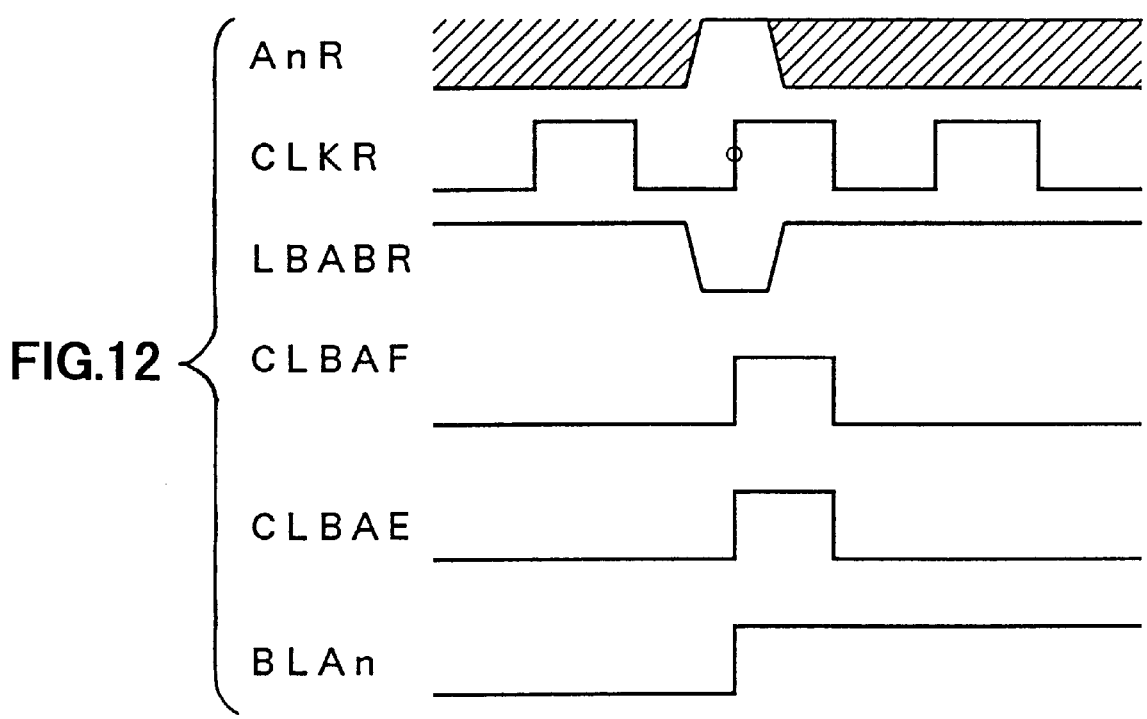
FIG. 12 is a timing chart of the address buffer shown in FIG. 11.

Referring to FIG. 12, when the address bits A0R–AnR are supplied from the outside of the memory device and then the pulse signals CLBAF and CLBAE and the inverted pulse signals CLBAFB and CLBAEB from the address acquisition timing generating circuit 4, the address buffer latches the address AnR in synchronism with the rising edges of the pulse signals CLBAF and CLBAE. Then, the latched address is output as an internal address BLAn. The address buffers associated with the other address bits operate in the same manner as described above.

Figure 13:
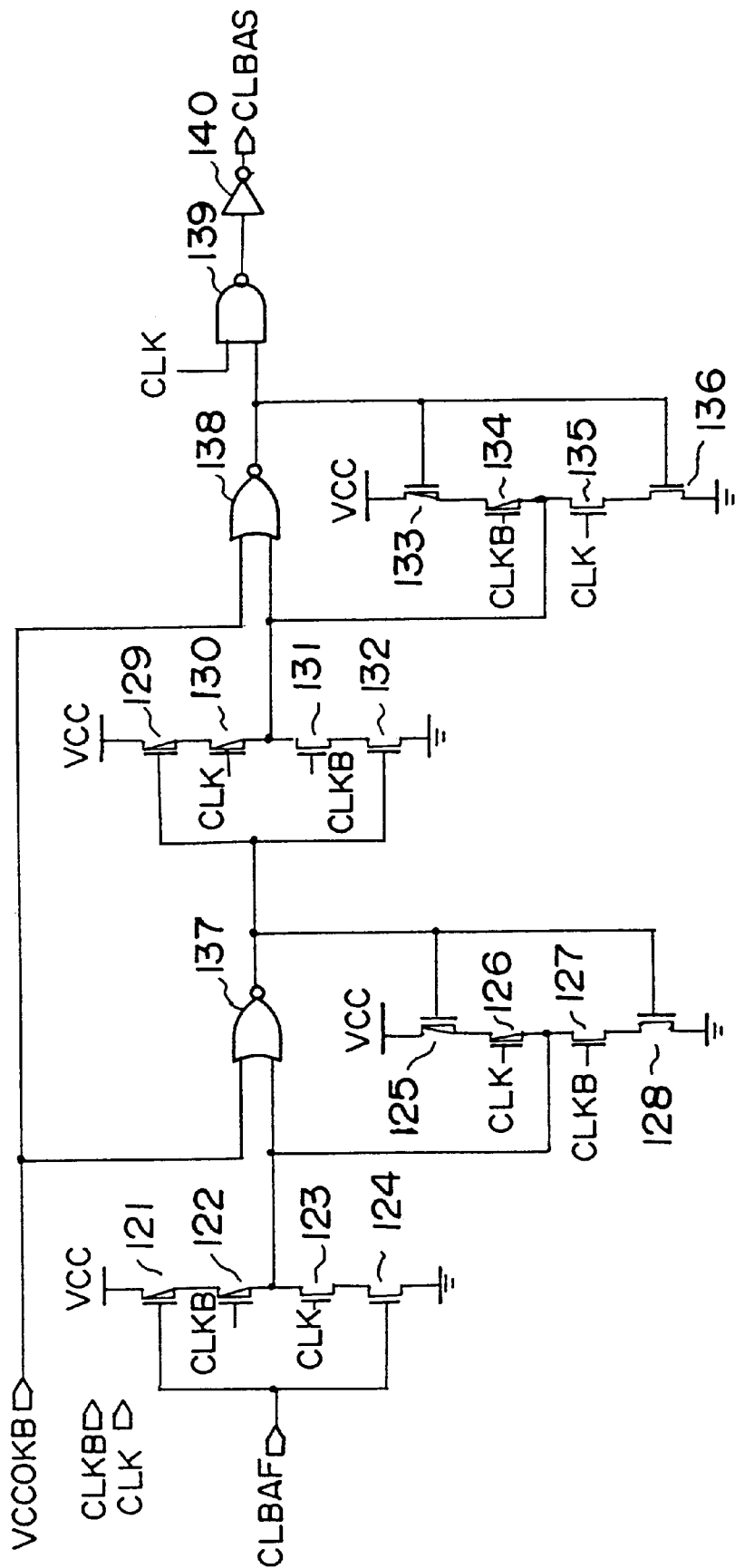
FIG. 13 is a circuit diagram of a shifter shown in FIG. 3.

FIG. 13 is a circuit diagram of the shifter 7, which is made up of transistors 121–136, an inverter 140, a NAND gate 139, and NOR gates 137 and 138. A signal VCCOKB is fixed to the low level.

Figure 14:
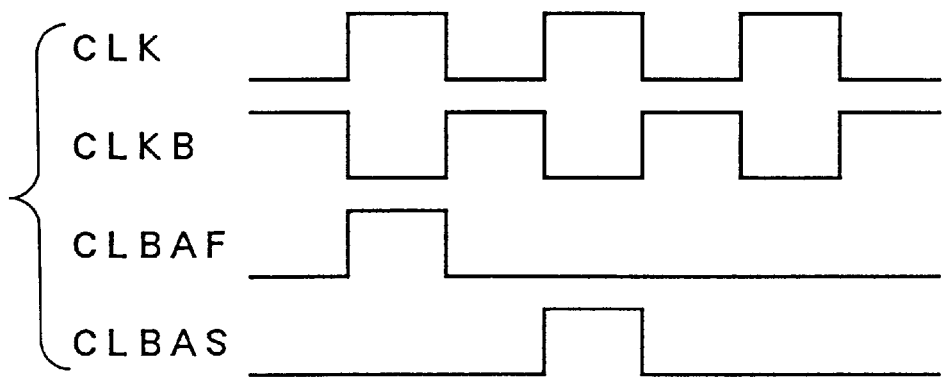
FIG. 14 is a timing chart of an operation of the shifter shown in FIG. 13.

Referring to FIG. 14, when the pulse signal CLBAF from the address acquisition timing generating circuit 4 is input in a state in which the first and second internal clocks CLK and CLKB are continuously input, the shifter 7 outputs a pulse signal CLBAS, which is delayed by one clock with respect to the pulse signal CLBAF and is synchronized with the first internal clock CLK. The above pulse signal CLBAS is a trigger signal used to activate the sense amplifiers of the memory cell block which is to be selected after the memory cell block specified by the external address is selected.

Figure 15A:
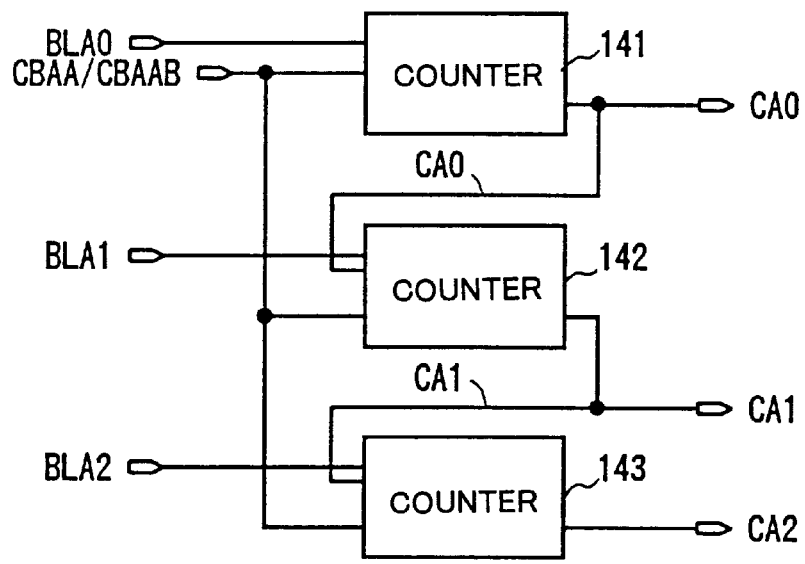
FIGS. 15A, 15B and 15C are block diagrams of a configuration of the address counter shown in FIG. 3.
Figure 15B:
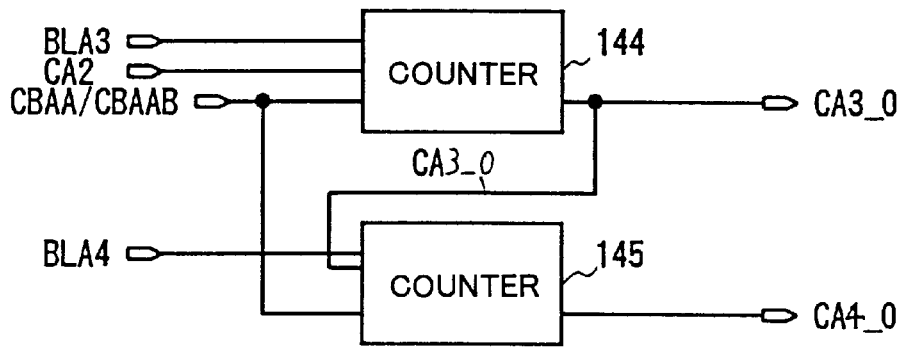
Figure 15C:
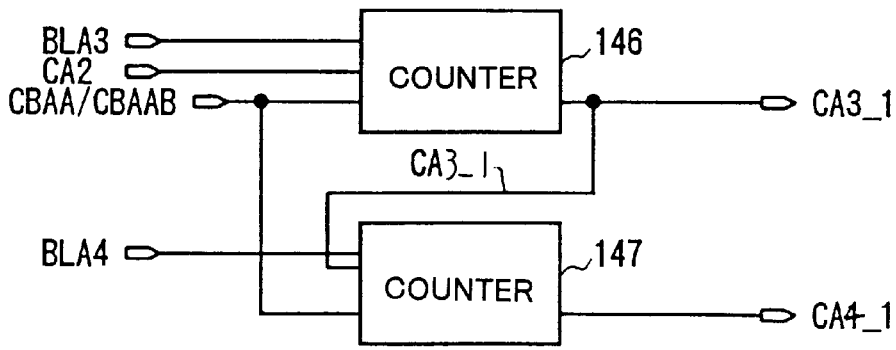

FIGS. 15A, 15B and 15C are respectively circuit diagrams of a configuration of the address counter 8, which is made up of a three-bit counter shown in FIG. 15A, a counter for the first block 1 shown in FIG. 15B, and another counter for the second block 2 shown in FIG. 15C.

The three-bit counter shown in FIG. 15A includes counters 141, 142 and 143 respectively supplied with the three lower bits BLA0, BLA1 and BLA2 of the internal address. The counters 141–142, and 143 respectively output count values CA0, CA1 and CA2 in synchronism with the third internal clock CBAA or the fourth internal clock CBAAB.

Figure 16:
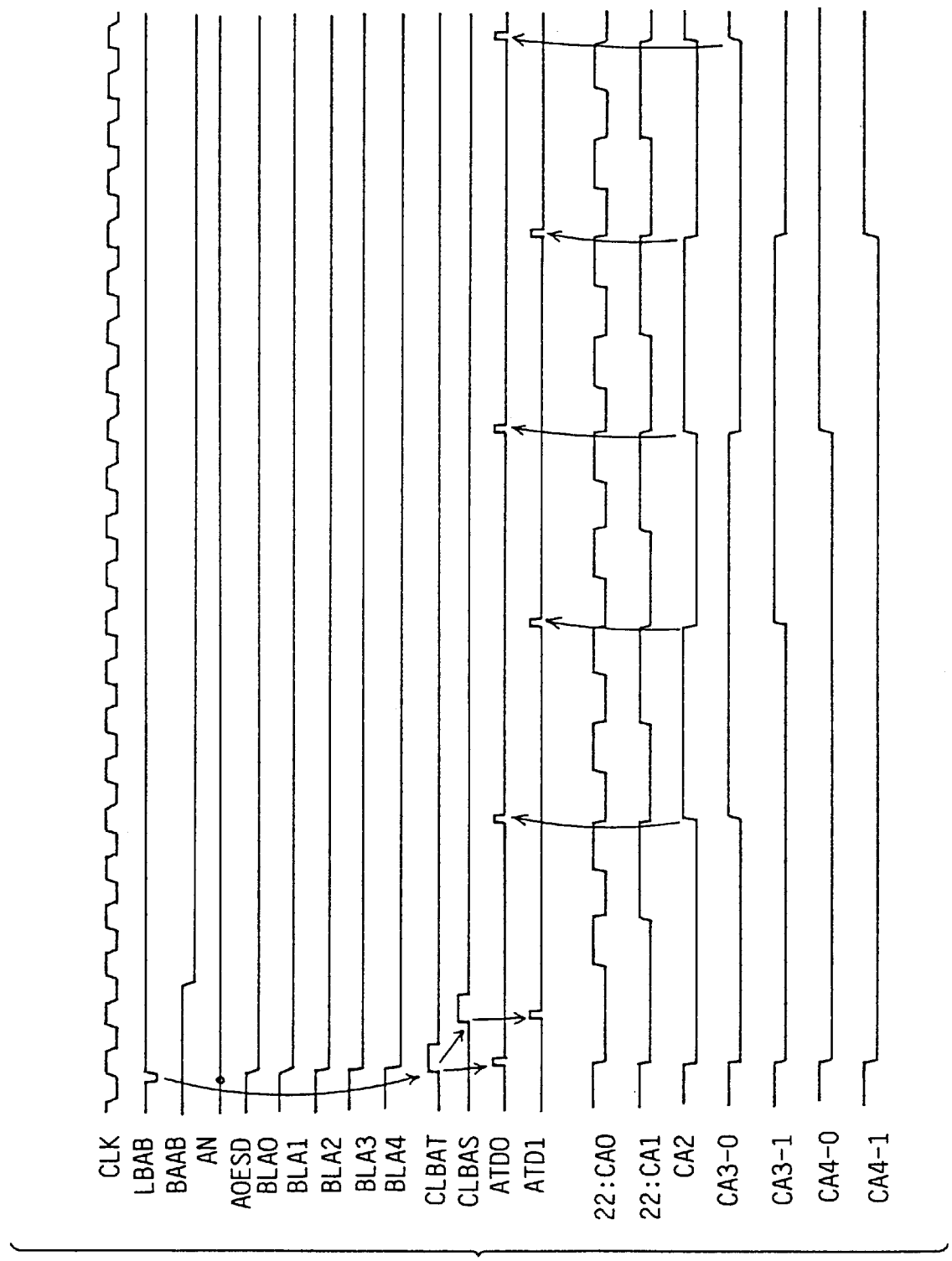
FIG. 16 is a timing chart of the address counter and an internal clock generating circuit shown in FIG. 3.

FIG. 16 is a timing chart of an operation in which the internal address bits BLA2, BLA1 and BLA0 respectively having values of 0 are loaded and the count values CA2, CA1 and CA0 change such as (0, 0, 0)→(0, 0, 1)→(0, 1, 0)→(0, 1, 1)→(1, 0, 0) . . . in synchronism with the third internal clock CBAA. The three-bit counter output selects either first block 1 or the second block 2 to be selected.

The counter for the first block 1 shown in FIG. 15B includes counters 144 and 145, which respectively receive internal address bits BLA3 and BLA4 and outputs count values CA3_0 and CA4_0 in synchronism with the count value CA2 and the third internal clock CBAA or the fourth internal clock CBAAB. The counter for the second block 2 shown in FIG. 15C includes counters 146 and 147, which respectively receive the internal address bits BLA3 and BLA4 and outputs count values CA3_1 and CA4_1 in synchronism with the count value CA2 and the third internal clock CBAA or the fourth internal clock CBAAB. As shown in FIG. 16, there is a delay between the CA3_0 and CA3_1 and a delay between the CA4_0 and CA4_1.

Figure 17A:
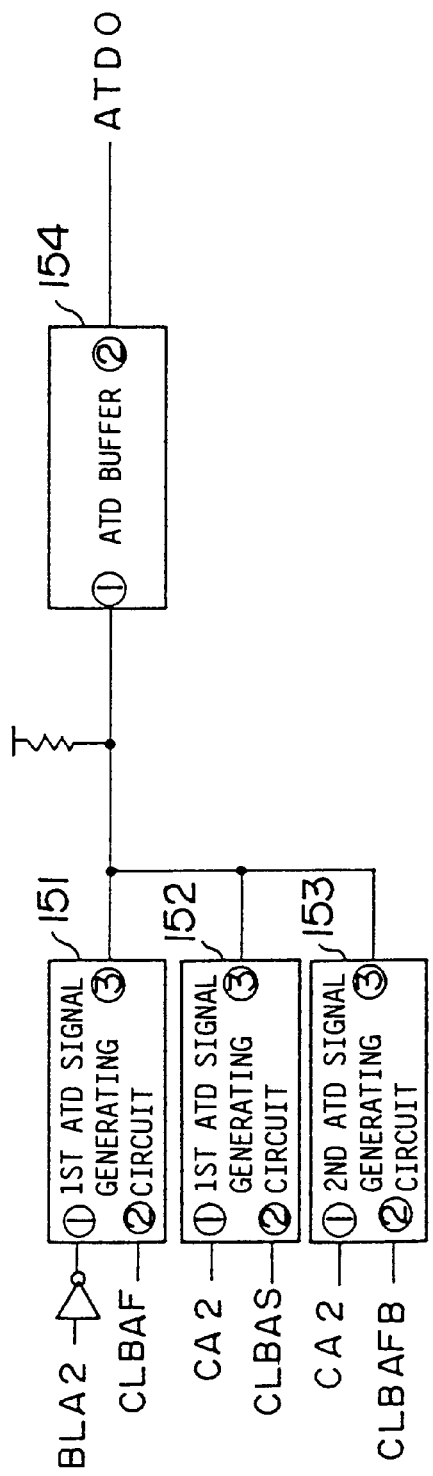
FIGS. 17A and 17B are block diagrams of the internal clock generating circuit shown in FIG. 3.
Figure 17B:
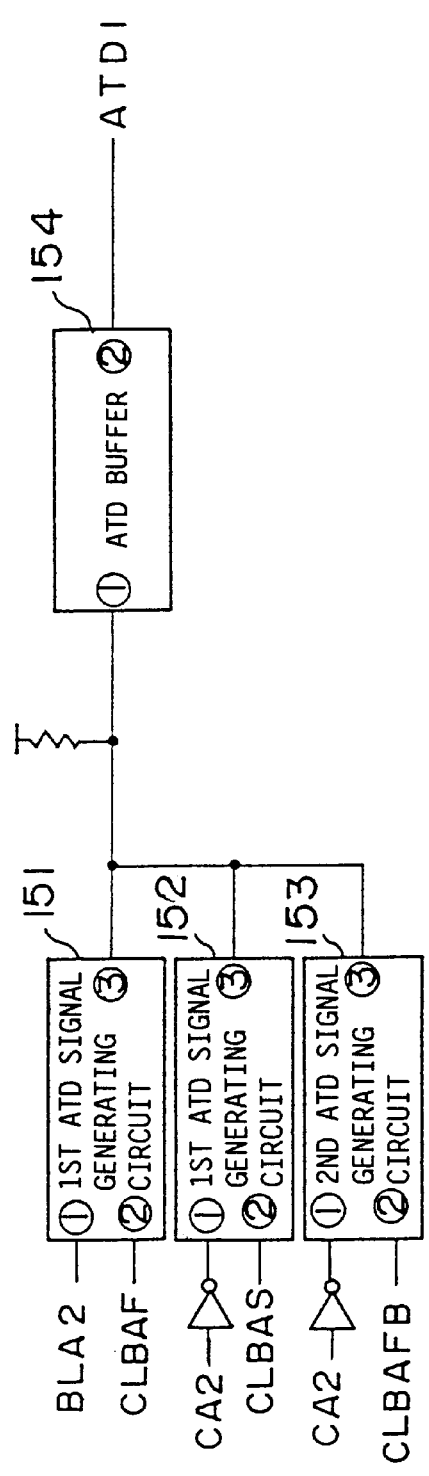

FIGS. 17A and 17B show configurations of the internal clock generating circuits 25 and 27, respectively. Each of the circuits 25 and 27 is made up of first ATD (Automatic Transition Detection) signal generating circuits 151 and 152, a second ATD signal generating circuit 153, and an ATD buffer 154.

Figure 19:
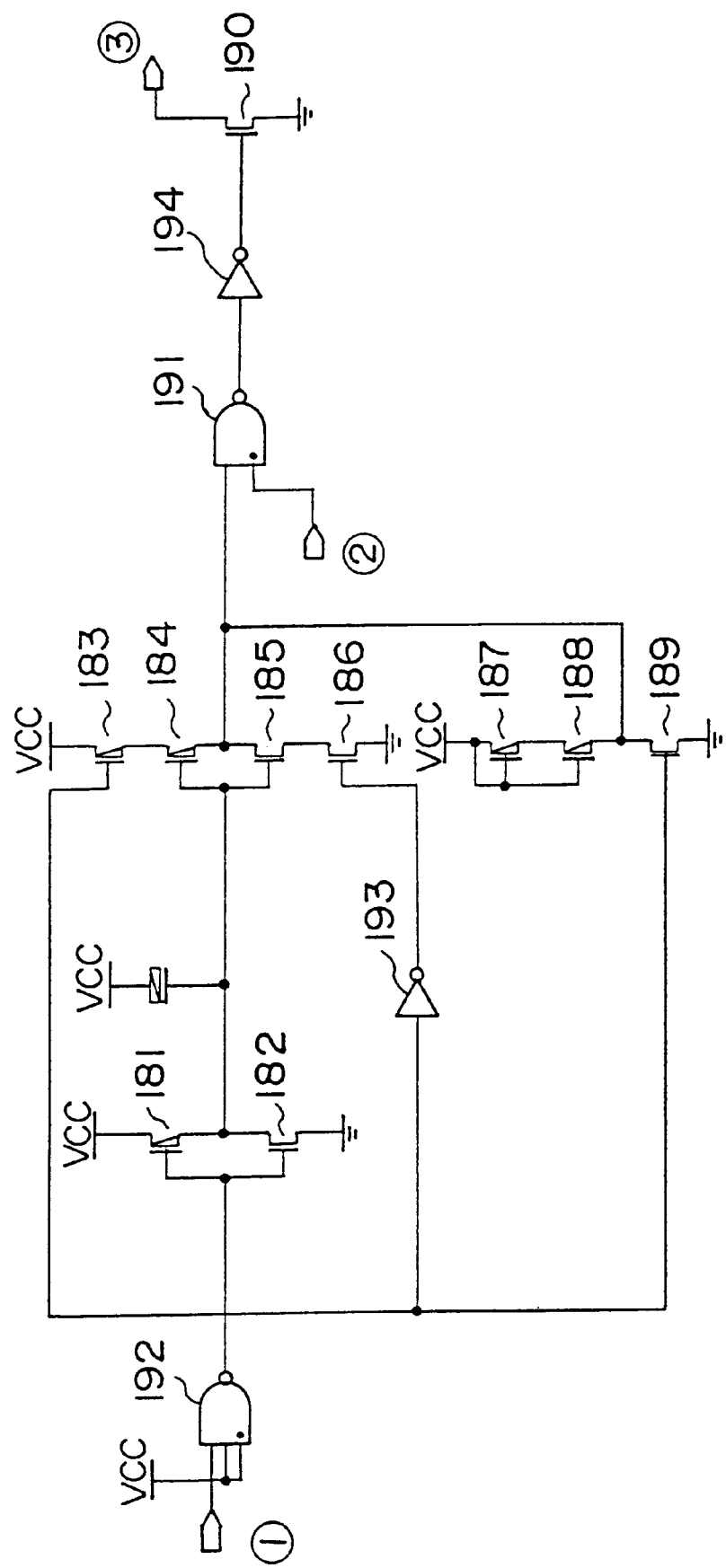
FIG. 19 is a circuit diagram of a second ATD signal generating circuit shown in FIGS. 17A and 17B.
Figure 20:
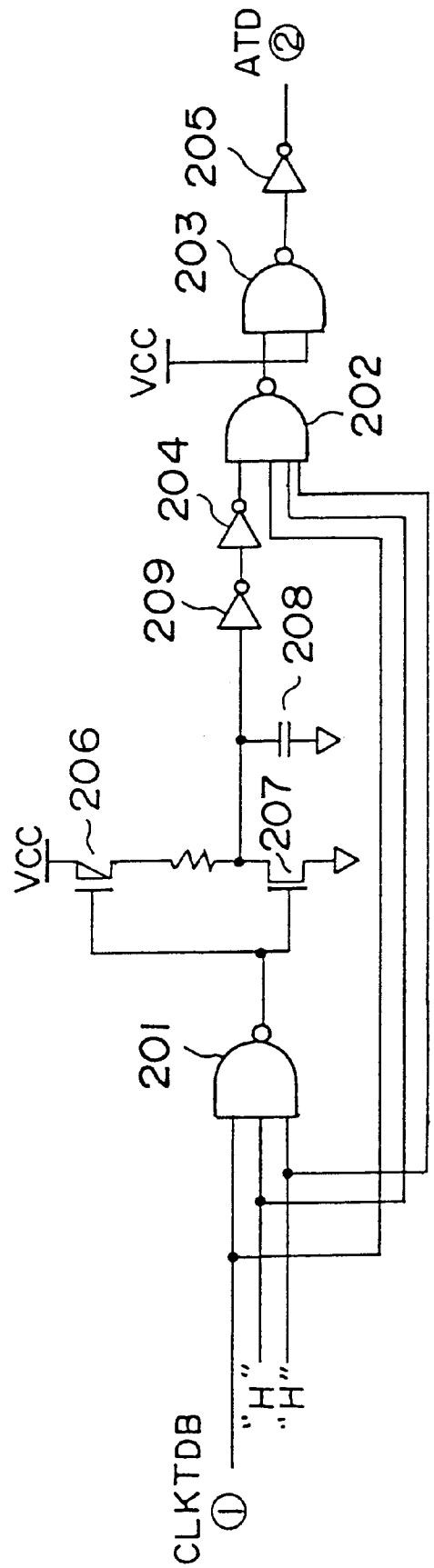
FIG. 20 is a circuit diagram of an ATD buffer shown in FIGS. 17A and 17B.

As shown in FIG. 18, each of the first ATD signal generating circuits 151 and 152 is made up of transistors 161–170, a NAND gate 171, and an inverter 172. As shown in FIG. 19, the second ATD signal generating circuit 153 is made up of transistors 181–190, NAND gates 191 and 192, and inverters 193 and 194. As shown in FIG. 20, the ATD buffer 154 is made up of transistors 206 and 207, NAND gates 201–203, and inverters 204–206 and 209.

As shown in FIG. 16, the internal clock generating circuit 25 switches an activation signal ATD0 for activating the sense amplifiers in the first block 1 to the high level, when the internal address bit BLA2 is at the low level and the pulse signal CLBAF is at the high level, or when the count value CA2 is high and the pulse signal CLBAS is at the high level, or when the count value CA2 is high and the pulse signal CLBAFB is at the high level.

The internal clock generating circuit 27 switches an activation signal ATD1 for activating the sense amplifiers in the second block 1 to the high level, when the internal address bit BLA2 is at the high level and the pulse signal CLBAF is at the high level, or when the count value CA2 is high and the pulse signal CLBAS is at the high level, or when the count value CA2 is low and the pulse signal CLBAFB is at the high level.

Figure 21:
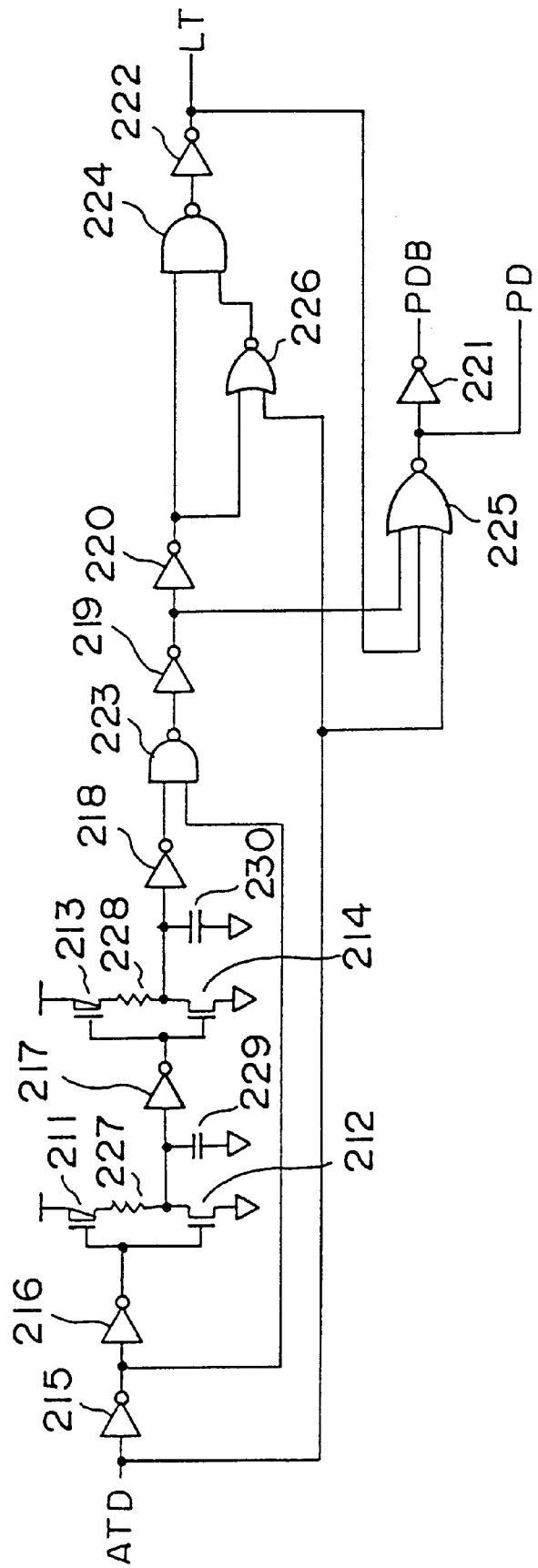
FIG. 21 is a circuit diagram of a sense amplifier activation circuit shown in FIG. 3.
Figure 22:
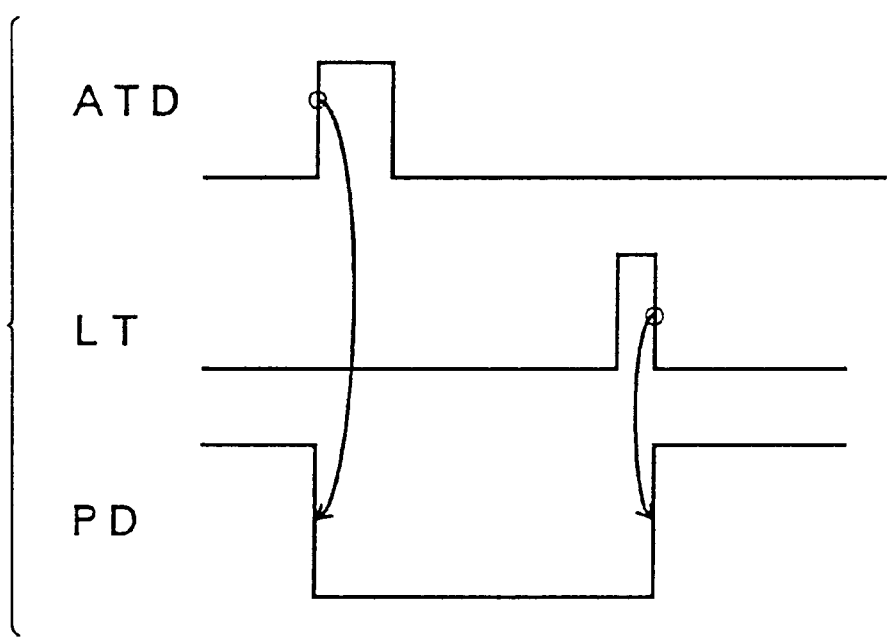
FIG. 22 is a timing chart of an operation of the sense amplifier activation circuit shown in FIG. 21.

FIG. 21 is a circuit diagram of the sense amplifier activation circuits 25 and 28, each of which includes transistors 211–214, inverters 215–222, NAND gates 223 and 224, NOR gates 225 and 226, resistors 227 and 228, and capacitors 229 and 230. For example, when the activation signal ATD0 is input (high-level pulse signal), the sense amplifier activation circuit 25 starts activating the sense amplifiers, and then outputs, after a given time, a signal LT for holding data read from the memory cells. As shown in FIG. 22, during the time between the rising edge of the activation signal ATD0 and the falling edge of the signal LT, a power down signal PD is maintained at the low level, and another power down signal PDB is maintained at the high level. In response to the activation signal ATD1, the sense amplifier activation circuit 27 operates in the same manner as described above.

Figure 23A:
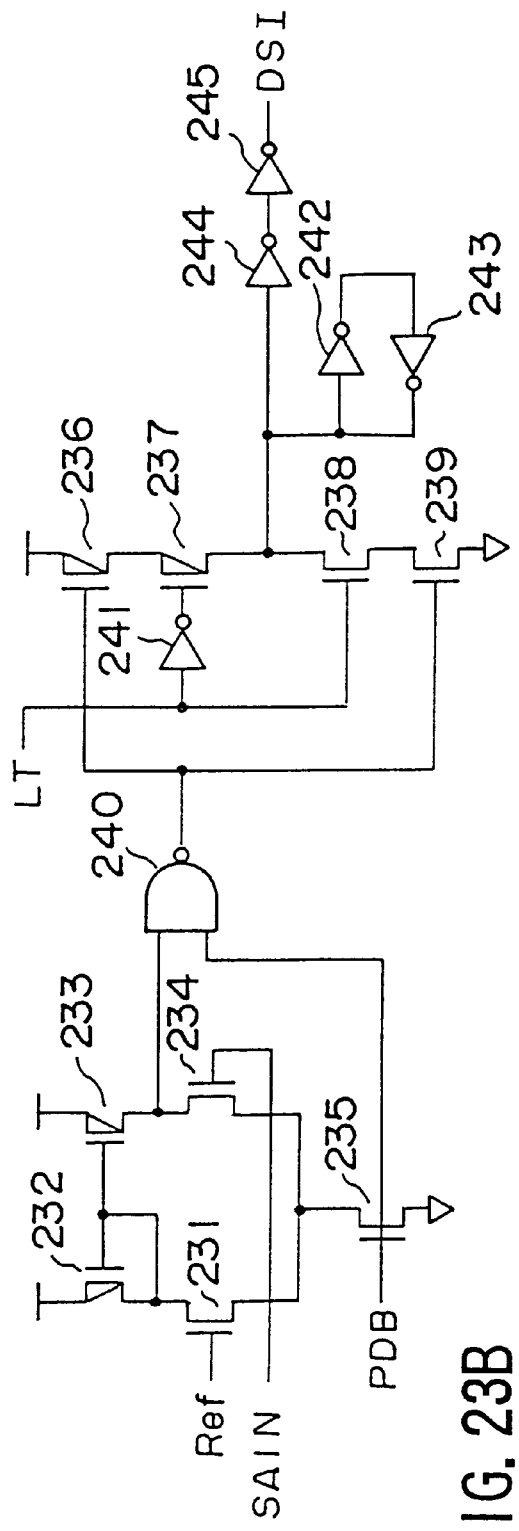
FIG. 23A is a circuit diagram of a sense amplifier.
Figure 23C:
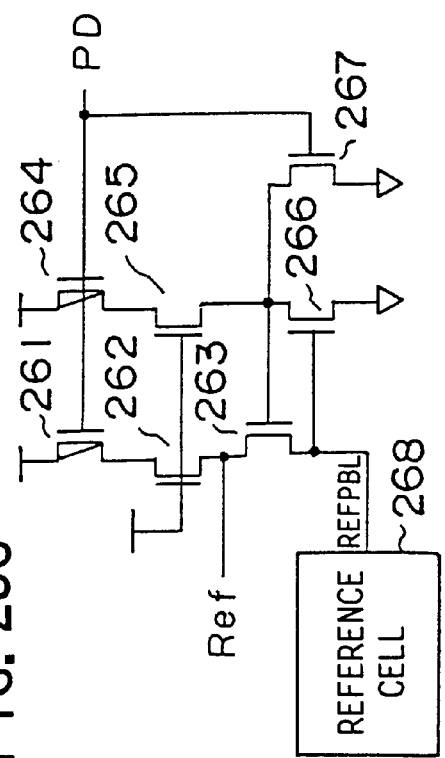
FIG. 23C is a circuit diagram of a reference cell and its peripheral circuit.
Figure 23B:
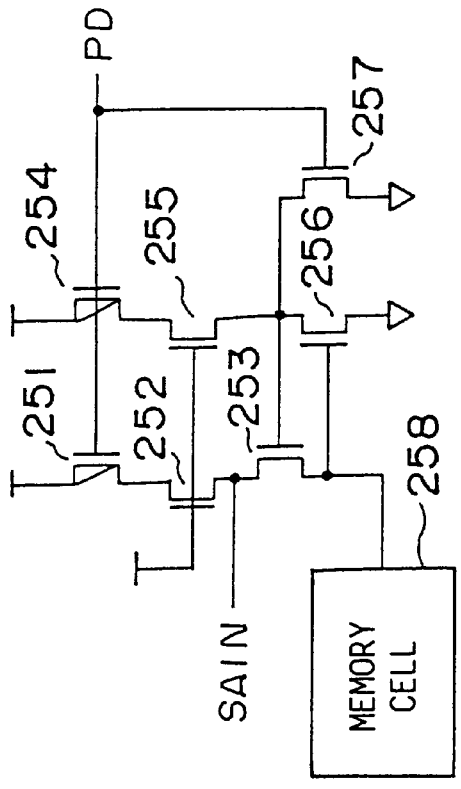
FIG. 23B is a circuit diagram of a memory cell and its peripheral circuit.
Figure 23D:
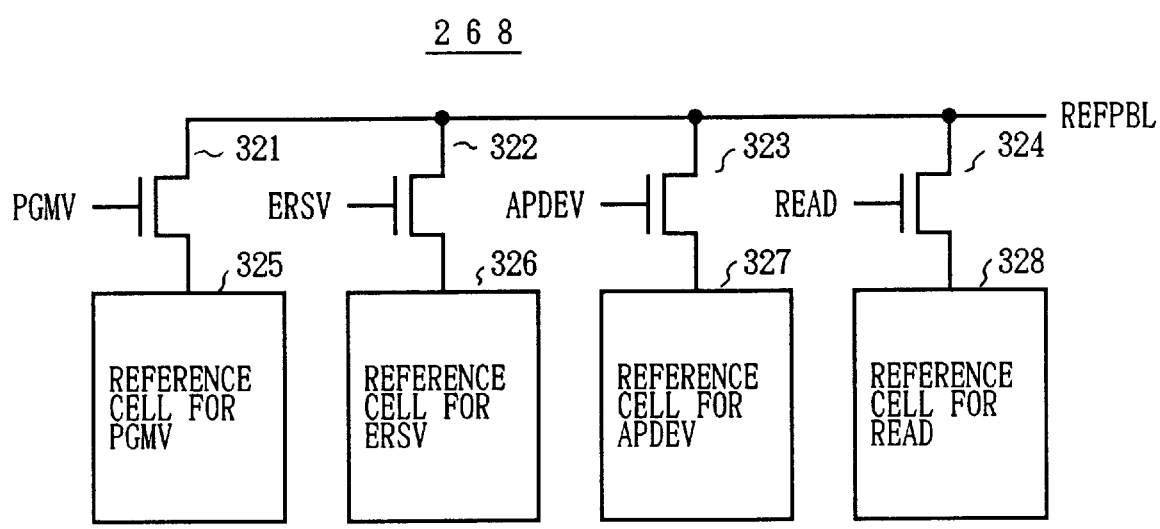
FIG. 23D is a block diagram of the reference cell shown in FIG. 23C.

FIG. 23A is a circuit diagram of a configuration of the sense amplifiers. The sense amplifier is made up of transistors 231–239, inverters 241–245, and a NAND gate 240. FIG. 23B is a circuit diagram of a peripheral circuit of a memory cell 258. The peripheral circuit includes transistors 251–257. FIG. 23C is a circuit diagram of a peripheral circuit of a reference cell 268. The peripheral circuit shown in FIG. 23C includes transistors 261–267. FIG. 23D is a circuit diagram of the reference cell 268.

The sense amplifier shown in FIG. 23A operates as follows. When the power down signal PDB which is at the high level is applied to the gate of the transistor 235, the sense amplifier compares a signal SAIN connected to the memory cell 258 shown in FIG. 23B and a signal Ref connected to the reference cell 268 shown in FIG. 23C with each other, and determines whether the memory cell data is high or low. Then, the sense amplifier holds the memory cell data at the timing of the high pulse of the signal LT, and outputs the held memory cell data as a data signal DSI.

The data stored in the memory cell 258 shown in FIG. 23B is output when the power down signal PD is at the low level. The data stored in the reference cell 268 shown in FIG. 23C is output when the power down signal is at the low.

The reference cell 268 is configured as shown in FIG. 23D. The reference cell 268 includes transistors 321–324 and reference cells 325–328 respectively connected thereto. When step S101 shown in FIG. 4 is executed, the transistor 321 is turned ON in response to a signal PGMV, and a voltage generated by the reference cell 325 is output as a reference cell signal REFPBL. When step S107 shown in FIG. 4 is executed, the transistor 322 is turned ON in response to a signal ERSV, and a voltage generated by the reference cell 326 is output as the reference cell signal REFPBL. When step S110 shown in FIG. 4 is executed, the transistor 323 is turned ON in response to a signal APDEV, and a voltage generated by the reference cell 327 is output as the reference cell signal REFPBL. When data is read, the transistor 324 is turned ON in response to a signal READ, and a voltage generated by the reference cell 328 is output as the reference cell signal REFPBL.

Figure 24:
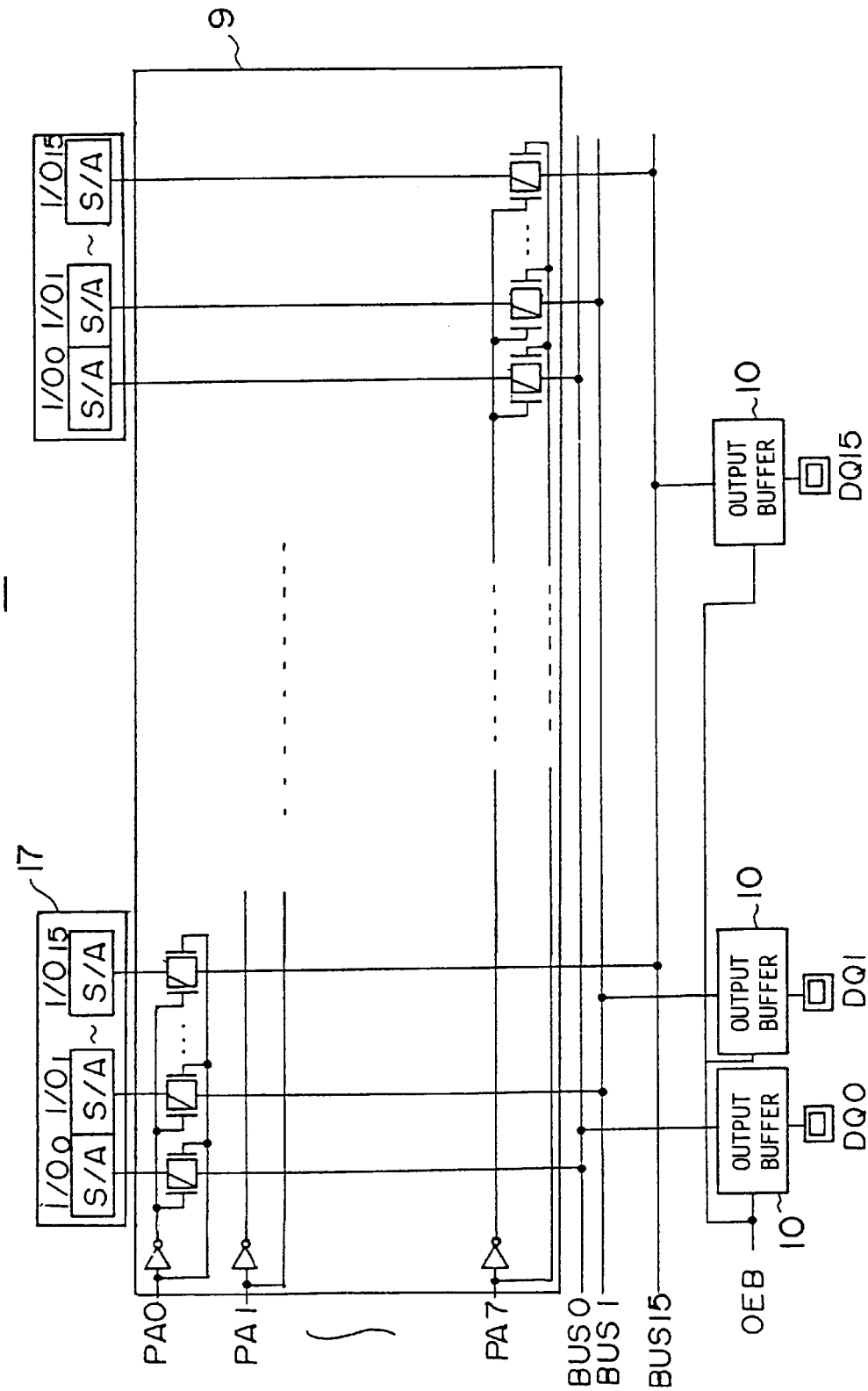
FIG. 24 is a block diagram of an output data switch circuit shown in FIG. 3.
Figure 25:
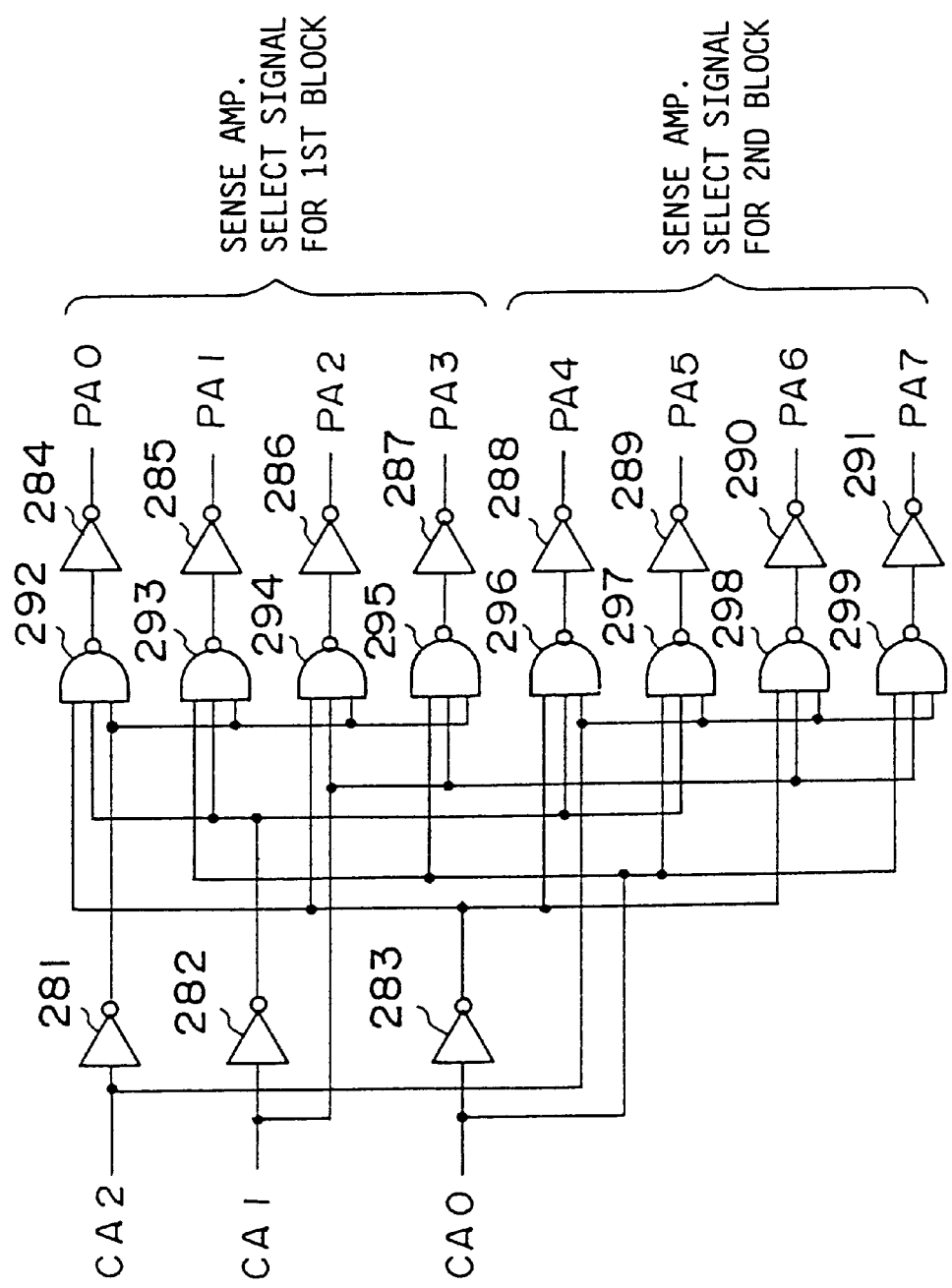
FIG. 25 is a circuit diagram of a sense amplifier select signal generating circuit shown in FIG. 3.

FIG. 24 is a block diagram of the output data switch circuit 9 shown in FIG. 3. The circuit 9 receives sense amplifier select signals PA0–PA7 used to select one of the sense amplifier groups 17–24. The sense amplifier select signals PA0–PA7 turn ON/OFF connected to outputs of the sense amplifiers of the sense amplifier groups 17–24, respectively. Thus, data read from only one of the sense amplifier groups 17–24 is output from the output data switch circuit 9. Each of the sense amplifier groups 17–24 includes 16 sense amplifiers, and thus each of the sense amplifier select signals PA0–PA7 turns ON/OFF 16 output transistors of the corresponding sense amplifier group.

The sense amplifier select signals PA0–PA7 are generated by a sense amplifier select signal generating circuit. The circuit 10 decodes the count values CA0–CA2 output from the address counter 8, and outputs one of the sense amplifier select signals PA0–PA7. Thus, the sense amplifier select signals PA0–PA7 are sequentially selected one by one in accordance with the specified burst length. The sense amplifier signal generating circuit may be provided anywhere on the chip, for example, in the address counter 8, the row decoders 13 and 14, or the output data switch circuit 9.

Figure 26:
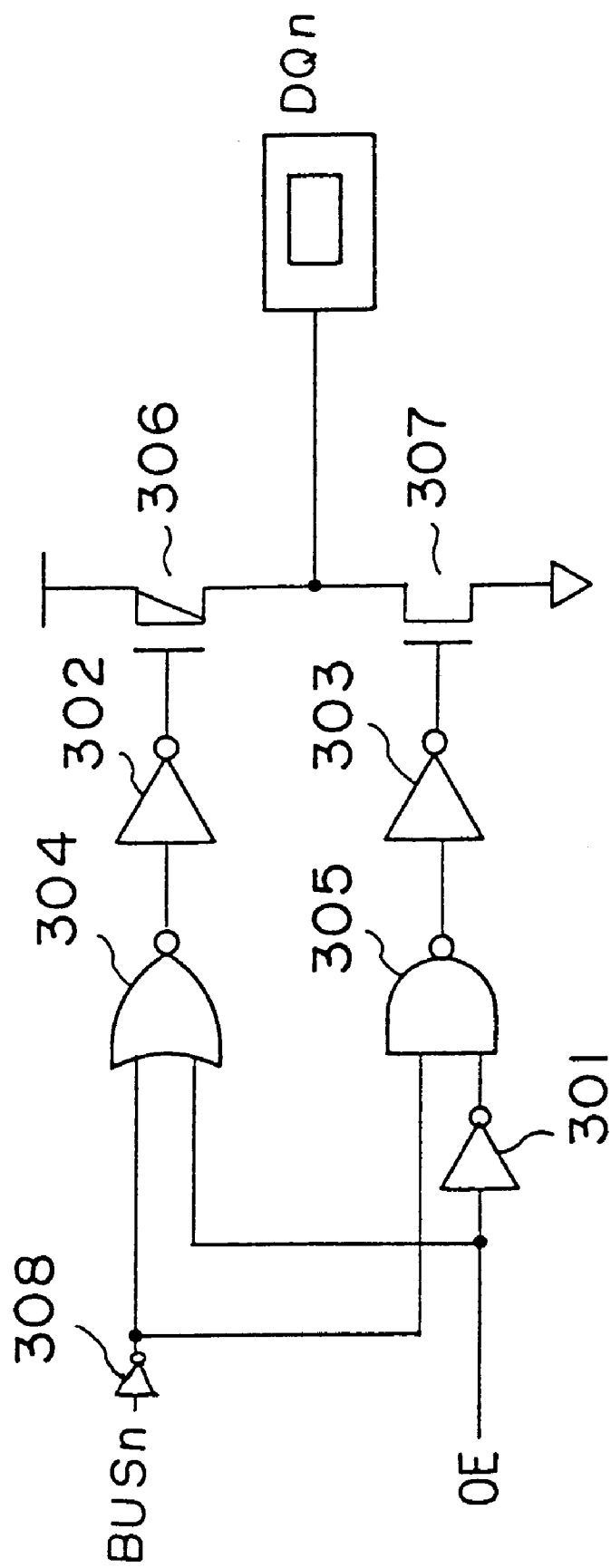
FIG. 26 is a circuit diagram of an output buffer shown in FIG. 3.

FIG. 26 is a circuit diagram of the output buffer 10 shown in FIG. 3. The output buffer 10 is made up of inverters 301, 302, 303, 308, a NOR gate 304, a NAND gate 305, and transistors 306 and 307. When the output enable signal OE is at the low level, a data bus signal BUSn (n is an integer) on which data is carried is output to a data output terminal DQn.

The present invention is not limited to the specifically disclosed embodiments, and variations and modifications may be made without departing from the scope of the present invention.

What is claimed is:

1. A non-volatile semiconductor memory device comprising:

memory cell blocks in which n sectors for erasing are defined where n is an integer equal to or greater than 1, each of the memory cell blocks comprising:

sense amplifiers; and an activation signal generating circuit generating an activation signal for activating the sense amplifiers, data held in the sense amplifiers of the memory cell blocks being continuously output in accordance with a burst length, sectors related to blocks corresponding to the burst length being sequentially subjected to an erase operation.

2. The non-volatile semiconductor memory device as claimed in claim 1, wherein:

the activation signal generating circuit provided in one of the memory cell blocks corresponding to an address externally supplied generates the activation signal which activates the sense amplifiers provided in said one of the memory cell blocks; and the activation signal generating circuit provided in a next one of the memory cell blocks generates the activation signal after the activation signal generating circuit in said one of the memory cell blocks generates the activation signal.

3. The non-volatile semiconductor memory device as claimed in claim 1, wherein:

the activation signal generating circuit provided In one of the memory cell blocks corresponding to an address externally supplied generates the activation signal which activates the sense amplifiers provided in said one of the memory cell blocks; and the activation signal generating circuit provided in a next one of the memory cell blocks generates the activation signal at the same time as the activation signal generating circuit in said one of the memory cell blocks generates the activation signal.

4. The non-volatile semiconductor memory device as claimed in claim 1, wherein the activation signal generating circuits provided in the memory cell blocks corresponding to the burst length sequentially generates the activation signals for activating the respective sense amplifiers so that the sense amplifiers are sequentially activated on the block basis.

5. The non-volatile semiconductor memory device as claimed in claim 1, wherein each of the sense amplifiers holds data of a plurality of bits.

6. The non-volatile semiconductor memory device as claimed in claim 1, further comprising:

an address buffer which buffers an address externally supplied; and an address counter which generates an updated address starting from the address buffered in the address buffer in accordance with the burst length.

7. The non-volatile semiconductor memory device as claimed in claim 1, further comprising an output data switch which selectively outputs data from the sense amplifiers of the memory cell blocks.

8. The non-volatile semiconductor memory device as claimed in claim 1, further comprising:

a command receive circuit which receives a command externally supplied; and a control circuit which selects, in response to the command, the sectors related to the blocks corresponding to the burst length one by one and subjects a selected one of the sectors to the erase operation.

9. The non-volatile semiconductor memory device as claimed in claim 1, further comprising:

a command receive circuit which receives a command externally supplied; and a control circuit which selects, in response to the command, one of the sectors related to the blocks corresponding to the burst length and subjects said one of the sectors to the erase operation and which sequentially selects remaining sectors one by one and subjects a selected one of the remaining sectors to the erase operation.

* * * * *